United States Patent
Uchida et al.

(10) Patent No.: US 10,768,496 B2
(45) Date of Patent: Sep. 8, 2020

(54) THIN FILM TRANSISTOR SUBSTRATE AND DISPLAY PANEL

(71) Applicant: Sharp Kabushiki Kaisha, Sakai, Osaka (JP)

(72) Inventors: Seiichi Uchida, Sakai (JP); Kuniaki Okada, Sakai (JP); Naoki Ueda, Sakai (JP); Takahiro Sasaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 320 days.

(21) Appl. No.: 15/779,103

(22) PCT Filed: Feb. 17, 2017

(86) PCT No.: PCT/JP2017/005939
§ 371 (c)(1),
(2) Date: May 25, 2018

(87) PCT Pub. No.: WO2017/145939
PCT Pub. Date: Aug. 31, 2017

(65) Prior Publication Data
US 2018/0348560 A1  Dec. 6, 2018

(30) Foreign Application Priority Data
Feb. 24, 2016 (JP) ................................ 2016-032886

(51) Int. Cl.
*G02F 1/1368* (2006.01)
*G09F 9/30* (2006.01)
(Continued)

(52) U.S. Cl.
CPC ...... *G02F 1/1368* (2013.01); *G02F 1/133345* (2013.01); *G02F 1/133512* (2013.01);
(Continued)

(58) Field of Classification Search
None
See application file for complete search history.

(56) References Cited

U.S. PATENT DOCUMENTS

2013/0057793 A1* 3/2013 Uchida ............... H01L 27/1225
349/42
2013/0201420 A1* 8/2013 Misaki ................. H01L 29/458
349/46
(Continued)

FOREIGN PATENT DOCUMENTS

| JP | 5330603 B2 | 10/2013 |
|----|-----------|---------|
| WO | 2011/142061 A1 | 11/2011 |
| WO | 2011/142064 A1 | 11/2011 |

OTHER PUBLICATIONS

Official Communication issued in International Patent Application No. PCT/2017/005939, dated May 16, 2017.

*Primary Examiner* — Ryan Crockett
(74) *Attorney, Agent, or Firm* — Keating & Bennett, LLP

(57) ABSTRACT

An array board 11b includes a gate line 19, a TFT 17, a pixel electrode 18, a display pixel PX, and a second interlayer insulation film 27. The TFT 17 includes a gate electrode 17a formed from a part of the gate line 19, a channel section 17d formed from an oxide semiconductor film 24, a source section 17b connected to one end of the channel section 17d, and a drain section 17c connected to another end of the channel section 17d and formed from the oxide semiconductor film 24 having resistance lower than the channel section 17d. The pixel electrode 18 is connected to the drain section 17c. The display pixel PX includes the TFT 17 and the pixel electrode 18. The second interlayer insulation film 27 has a second hole in a position overlapping the pixel electrode and the drain section 17c and not overlapping the gate electrode 17a.

9 Claims, 19 Drawing Sheets

(51) Int. Cl.
   *G02F 1/1333* (2006.01)
   *G02F 1/1362* (2006.01)
   *H01L 29/786* (2006.01)
   *H01L 27/12* (2006.01)
   *G02F 1/1335* (2006.01)
   *H01L 23/532* (2006.01)
   *H01L 29/08* (2006.01)
   *H01L 29/423* (2006.01)

(52) U.S. Cl.
   CPC .. *G02F 1/133514* (2013.01); *G02F 1/136227* (2013.01); *G02F 1/136286* (2013.01); *G09F 9/30* (2013.01); *H01L 23/5329* (2013.01); *H01L 27/124* (2013.01); *H01L 27/1225* (2013.01); *H01L 27/1248* (2013.01); *H01L 29/0847* (2013.01); *H01L 29/42384* (2013.01); *H01L 29/7869* (2013.01); *H01L 29/78618* (2013.01); *H01L 29/78633* (2013.01); *G02F 2201/123* (2013.01); *G02F 2201/40* (2013.01)

(56) References Cited

U.S. PATENT DOCUMENTS

| | | | |
|---|---|---|---|
| 2013/0207114 A1* | 8/2013 | Suzuki | G02F 1/136286 |
| | | | 257/59 |
| 2014/0333864 A1* | 11/2014 | Miyake | G02F 1/13439 |
| | | | 349/43 |
| 2016/0204267 A1* | 7/2016 | Moon | H01L 27/1225 |
| | | | 257/43 |
| 2017/0170251 A1* | 6/2017 | Moon | H01L 29/7869 |

* cited by examiner

FIG.7
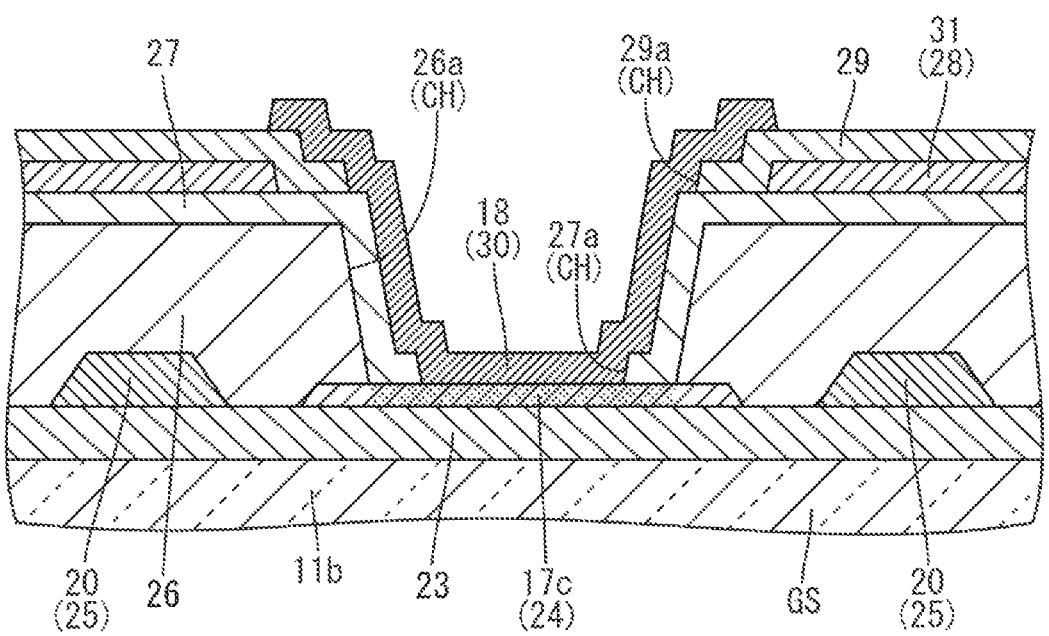
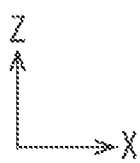

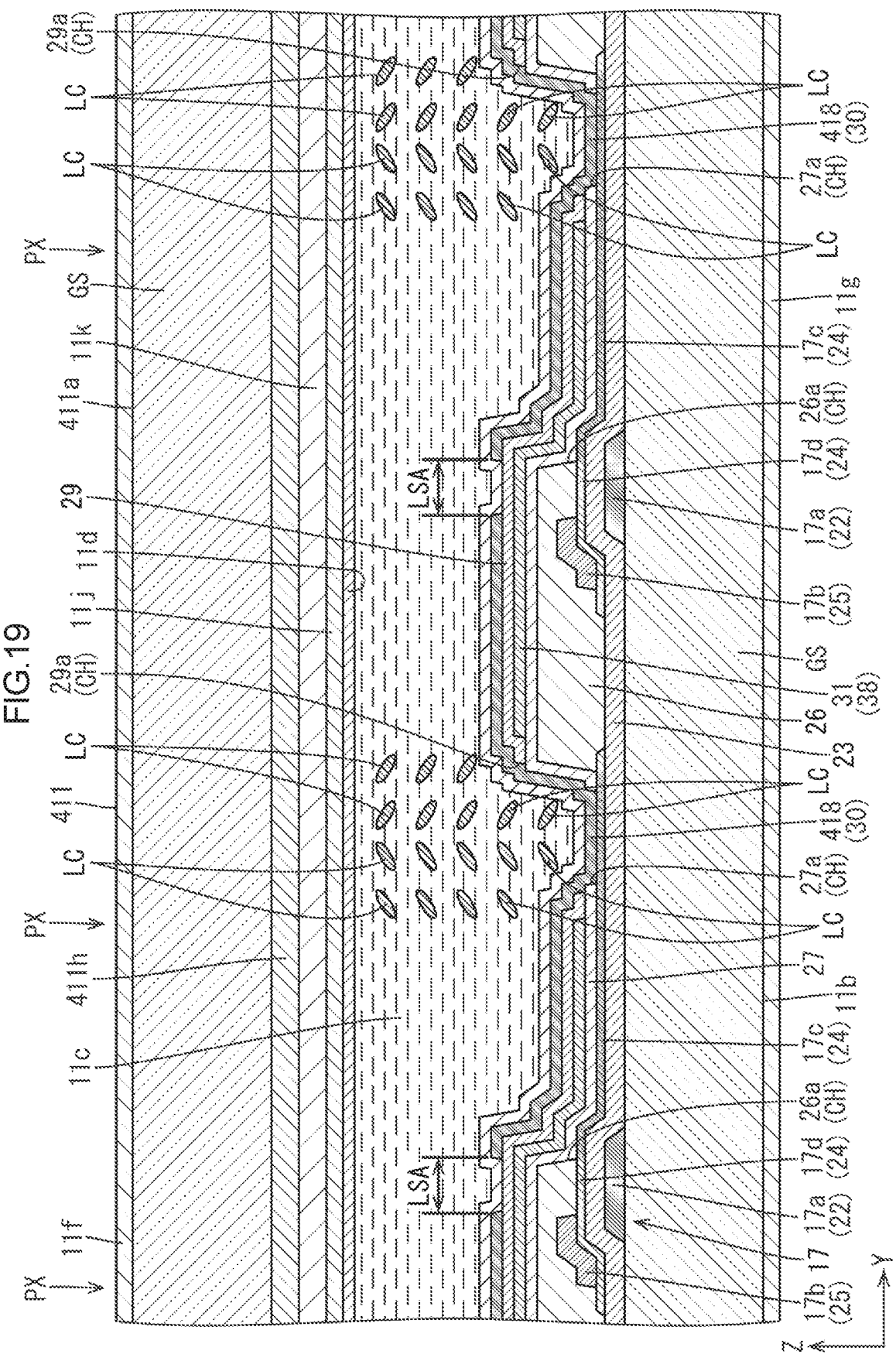

THIN FILM TRANSISTOR SUBSTRATE AND DISPLAY PANEL

TECHNICAL FIELD

The present invention relates to a thin film transistor substrate and a display panel.

BACKGROUND ART

A liquid crystal display device described in Patent Document 1 has been known as one example. The thin film transistor substrate included in the liquid crystal display device described in Patent Document 1 includes a source section and a drain section. The source section is made of a source metal provided above a gate insulating film and an oxide semiconductor film. The drain section includes a low resistance portion that is a part of the oxide semiconductor film, where the part includes a surface of the oxide semiconductor film opposite from the gate insulating film, and the resistance of the part is decreased.

RELATED ART DOCUMENT

Patent Document

Patent Document 1: Japanese Patent No. 5330603

Problem to be Solved by the Invention

In the liquid crystal display device described in Patent Document, the gate electrode is formed from a wide section of the gate line and the gate electrode is arranged above the contact hole formed for connecting the pixel electrode to the drain section. With the drain section formed from the low resistance portion of the oxide semiconductor film, the aperture ratio is not increased because of a light blocking section formed from the gate electrode, and precision is less likely to be improved.

DISCLOSURE OF THE PRESENT INVENTION

The present invention was made in view of the above circumstances and an object is to increase an aperture ratio.

Means for Solving the Problem

A thin film transistor substrate according to the present invention includes a gate line, a thin film transistor at least including a gate electrode formed from a part of the gate line, a channel section formed from an oxide semiconductor film and disposed such that a part of the channel section overlaps the gate electrode, a source section connected to one end of the channel section, and a drain section connected to another end of the channel section and formed from the oxide semiconductor film having resistance lower than that of the channel section, and the thin film transistor substrate further includes a pixel electrode a part of which overlaps the drain section and connected to the drain section, a pixel at least including the thin film transistor and the pixel electrode, and an insulation film disposed between the pixel electrode and the drain section and having a hole in a position overlapping the pixel electrode and the drain section and not overlapping the gate electrode.

According to such a configuration, in the thin film transistor, if a scanning signal is supplied to the gate line and the gate electrode that is a part of the gate line, the electrons move from the source section to the drain section via the channel section. The drain section is connected to the pixel electrode through the hole formed in the insulation film. Therefore, the electrons that are moved to the drain section move to the pixel electrode and thus, the pixel electrode is charged.

The drain section of the thin film transistor is formed from the oxide semiconductor film having resistance lower than that of the channel section. Therefore, the light transmission amount in the pixel is increased and the aperture ratio of the pixel is increased compared to the configuration including the drain section formed from the conductive material having a light blocking property. Furthermore, the insulation film has the hole in a position that does not overlap the gate electrode. Therefore, the arrangement of the gate lines and the hole has greater variation compared to a configuration that the hole overlaps the gate electrode, and the aperture ratio of the pixel is preferably increased.

Preferable embodiments of the thin film transistor substrate according to the present invention may include the following configurations.

(1) The pixel may include multiple pixels that are arranged while having a light blocking area between adjacent pixels, and the gate line may be arranged to overlap the light blocking area. According to such a configuration, the adjacent pixels are separated by the light blocking section such that each of the pixels can perform a display operation independently. The gate line at least a part of which forms the gate electrode of the thin film transistor is disposed to overlap the light blocking section. According to such a configuration, the aperture ratio of the pixel is increased and the display precision is preferably increased compared to the configuration that the gate line does not overlap the light blocking section.

(2) The thin film transistor substrate may further include a lower insulation film included in a lower layer of the insulation film and having a lower hole overlapping a whole area of the drain section. Thus, the lower insulation film disposed in the lower layer of the insulation film has the lower hole having an area overlapping an entire area of at least the drain section. During manufacturing, resistance of a part of the oxide semiconductor film is lowered through the lower hole in the lower insulation film, and the drain section is formed.

(3) The insulation film may be made of material containing hydrogen. Accordingly, hydrogen contained in the material of the insulation film is dispersed into the portion of the oxide semiconductor film exposed through the lower hole formed in the lower insulation film and the resistance of the exposed portion is lowered and the low resistance section forms the drain section.

(4) The pixel may include multiple pixels that are arranged at least in an extending direction in which the gate line extends, and the insulation film and the lower insulation film may be formed such that the hole and the lower hole are smaller in the extending direction than an arrangement interval of the pixels and the hole and the lower hole partially overlap each other. If the insulation film and the lower insulation film are provided such that an entire area of the lower hole is overlapped with the hole smaller than the arrangement interval of the pixels with respect to the extending direction of the gate line, the arrangement space for the pixels may be increased to keep a distance between the hole edge of the hole and the hole edge of the lower hole. According to the above-described configuration in that the hole and the lower hole that are smaller than the arrangement interval of the pixels with respect to the extending direction of the gate line are partially overlapped, it is not necessary to design precisely the position relation of the hole edge of the hole and the hole edge of the lower hole. Therefore, the arrangement interval between the pixels can be decreased and high display precision can be preferably achieved.

(5) The pixel may include multiple pixels that are arranged at least in an extending direction in which the gate line extends, and the lower insulation film may be formed such that the lower hole extends over the pixels that are adjacent to each other in the extending direction. According to such a configuration, the lower hole overlaps the hole regardless of the position of the hole with respect to the extending direction of the gate line. Namely, it is not necessary to design precisely the position relation of the lower hole and the hole with respect to the extending direction of the gate line. Therefore, the arrangement interval of the pixels can be decreased and the high display precision can be preferably achieved. In manufacturing, resistance is decreased in a larger area of the oxide semiconductor film through the lower hole of the lower insulation film, and the drain section is formed. Therefore, the resistance value of the drain section is decreased.

(6) The pixel may include multiple pixels that are arranged at least in an extending direction in which the gate line extends, and the insulation film may be formed such that the hole extends over the pixels that are adjacent to each other in the extending direction. According to such a configuration, the hole overlaps the lower hole regardless of the position of a lower hole with respect to the extending direction of the gate line. Namely, it is not necessary to design precisely the position relation of the lower hole and the hole with respect to the extending direction of the gate line. Therefore, the arrangement interval of the pixels can be decreased and the high display precision can be preferably achieved. Furthermore, compared to the configuration that the lower hole extends over the adjacent pixels in the extending direction of the gate line, the area in which the hole is formed is reduced in the direction perpendicular to the extending direction of the gate line. Therefore, it is easy to control film remaining in the area where the hole is formed and it is advantageous in manufacturing.

(7) The thin film transistor may include the source section, the channel section, and the drain section that are arranged in an arrangement direction, and the channel section and the drain section extend in an extending direction, and the arrangement direction may be parallel to the extending direction. According to such a configuration, the arrangement space of the thin film transistor in the extending direction of the gate line is reduced and the interval between the pixels is reduced. This is preferably for increasing display precision.

Next, to resolve the problem described earlier, a display panel according to the present invention includes the above thin film transistor substrate, and a counter substrate bonded to the thin film transistor substrate. According to the display panel having such a configuration, the aperture ratio of the pixels of the thin film transistor substrate is increased and the display precision is preferably increased.

A preferable embodiment of the display panel according to the present invention may include the following configurations.

(1) The display panel may further include a liquid crystal layer arranged between the thin film transistor substrate and the counter substrate and formed from liquid crystal material that is aligned vertical to surfaces of the thin film transistor substrate and the counter substrate. The hole formed in the insulation film of the thin film transistor substrate does not overlap the gate electrode. Therefore, with the configuration having the hole near a middle of the pixel, the liquid crystal molecules included in the liquid crystal layer can be radially oriented with using the hole. Therefore, compared to the configuration including a projection or a recess for controlling the alignment of the liquid crystal molecules in addition to the hole, the interval between the pixels can be decreased by an unnecessary space for the projection or the recess. Display precision can be further increased.

Advantageous Effect of the Invention

According to the present invention, an aperture ratio can be increased.

BRIEF DESCRIPTION OF THE DRAWINGS

FIG. 7 is a cross-sectional view of FIG. 4 along line B-B.

FIG. 19 is a schematic cross-sectional view of a liquid crystal display device illustrating a cross-sectional configuration in a display area.

MODES FOR CARRYING OUT THE INVENTION

<First Embodiment>

Figure 1:
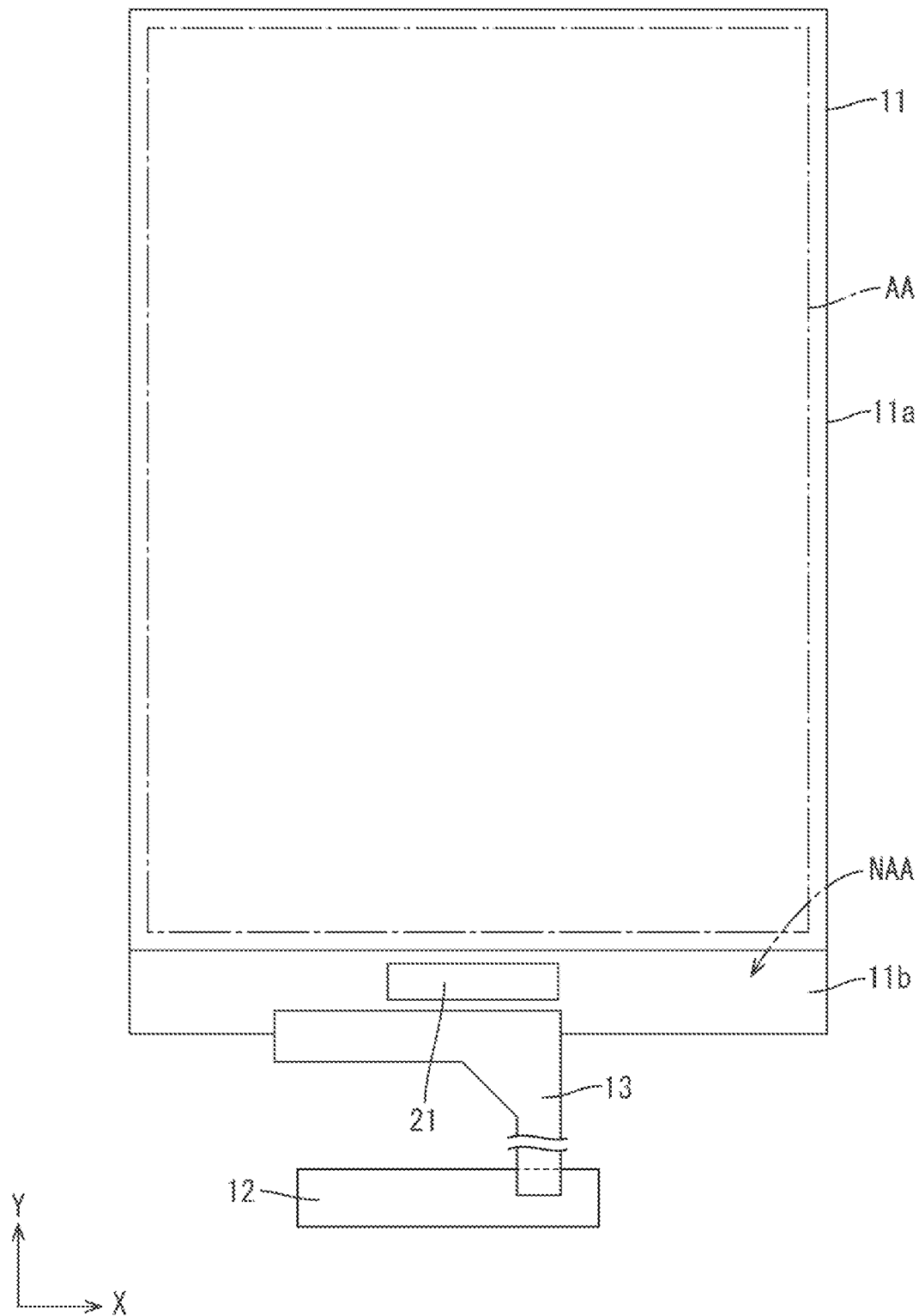
FIG. 1 is a schematic plan view of a liquid crystal panel on which a driver is mounted, a flexible printed circuit board, and a control circuit board according to a first embodiment illustrating connection among those.

A first embodiment will be described with reference to FIGS. 1 to 8. A liquid crystal display device 10 according to this embodiment will be described. X-axis, Y-axis and Z-axis may be indicated in the drawings. The axes in each drawing correspond to the respective axes in other drawings. The vertical direction is defined based on FIGS. 2, 3, 6, and 8. An upper side and a lower side in FIGS. 2, 3, 6, and 8 correspond to a front side and a back side of the liquid crystal display device 10, respectively.

Figure 2:
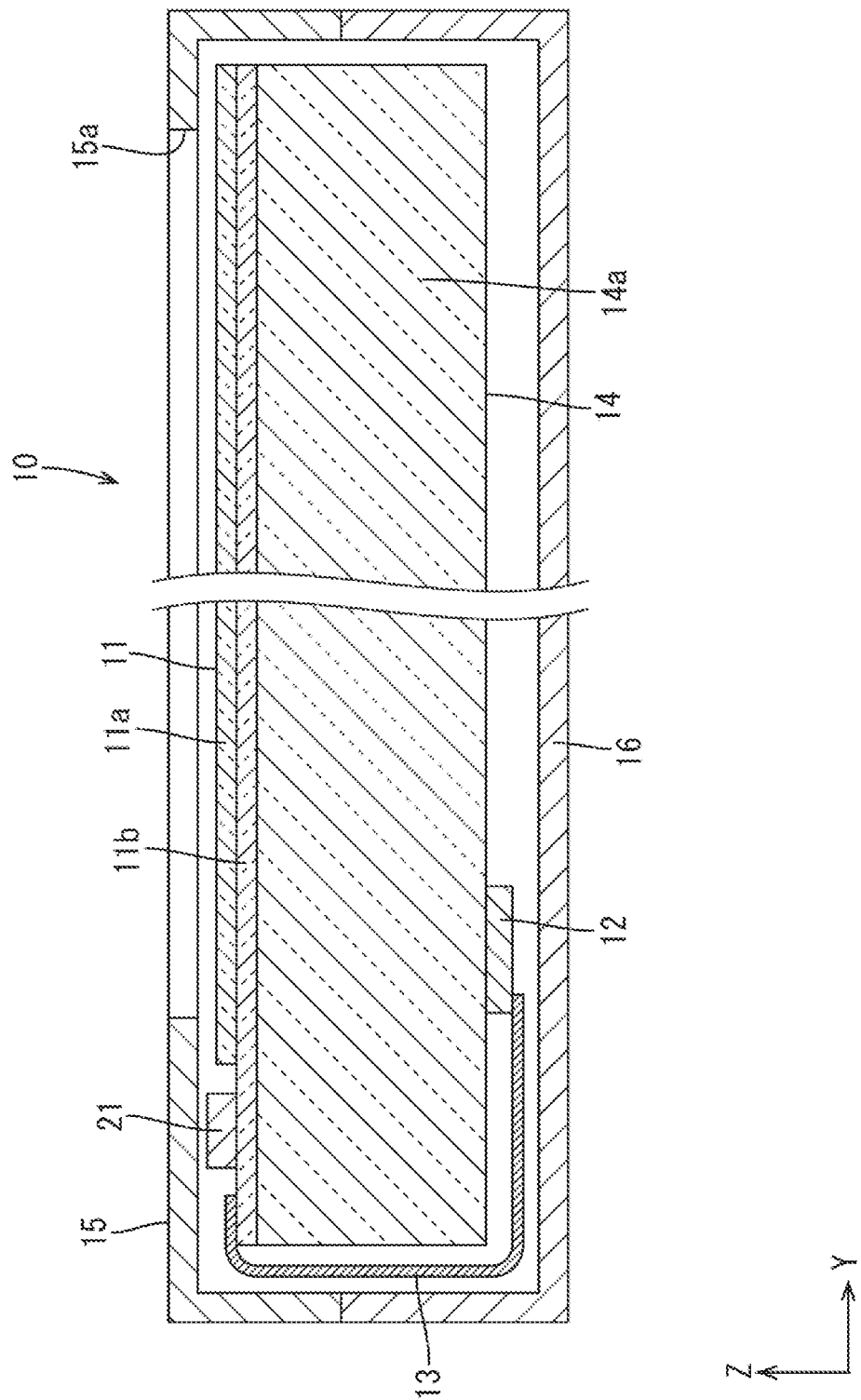
FIG. 2 is a schematic cross-sectional view of a liquid crystal display device illustrating a cross-sectional configuration along a long-side direction thereof.

As illustrated in FIGS. 1 and 2, the liquid crystal display device 10 includes a liquid crystal panel (a display device) 11, a driver (a pixel driver) 21, a control circuit board (an external signal source) 12, a flexible printed circuit board (an external connecting component) 13, and a backlight unit (a lighting device) 14. The driver 21 is configured to drive the liquid crystal panel 11. The control circuit board 12 is configured to supply various kinds of input signals to the liquid crystal panel 11 including the driver 21 from the outside. The flexible printed circuit board 13 electrically connects the liquid crystal panel 11 to the control circuit board 12 outside the liquid crystal panel 11. The backlight unit 14 is an external light source that supplies light to the liquid crystal panel 11. The liquid crystal display device 10 further includes a pair of exterior components 15 and 16 that are front and rear components used in a pair to hold the liquid crystal panel 11 and the backlight unit 14 that are attached together. The exterior component 15 on the front has an opening 15a through which images displayed on the liquid crystal panel 11 are viewed from the outside.

The backlight unit 14 will be described. As illustrated in FIG. 2, the backlight unit 14 includes a chassis 14a, light sources (e.g., cold cathode fluorescent tubes, LEDs, organic ELs), an optical member. The chassis 14a has a box-like shape with an opening on the front (on a liquid crystal panel 11 side). The light sources, which are not illustrated, are disposed inside the chassis 14a. The optical member, which is not illustrated, is arranged so as to cover the opening of the chassis 14a. The optical member has a function to convert light from the light sources into planar light.

Next, the liquid crystal panel 11 will be described. As illustrated in FIG. 1, the liquid crystal panel 11 has a vertically-long rectangular overall shape. The liquid crystal panel 11 includes a display area (an active area) AA that is off centered toward one of ends of a long dimension thereof (the upper side in FIG. 1). The driver 21 and the flexible printed circuit board 13 are arranged at the other end of the long dimension of the liquid crystal panel 11 (the lower side in FIG. 1). An area of the liquid crystal panel 11 outside the display area AA is a non-display area (non-active area) NAA in which images are not displayed. A short-side direction and a long-side direction of the liquid crystal panel 11 correspond to the X-axis direction and the Y-axis direction in each drawing. In FIG. 1, a chain line box slightly smaller than a CF board 11a indicates a boundary of the display area AA. An area outside the chain line is the non-display area NAA.

Figure 3:
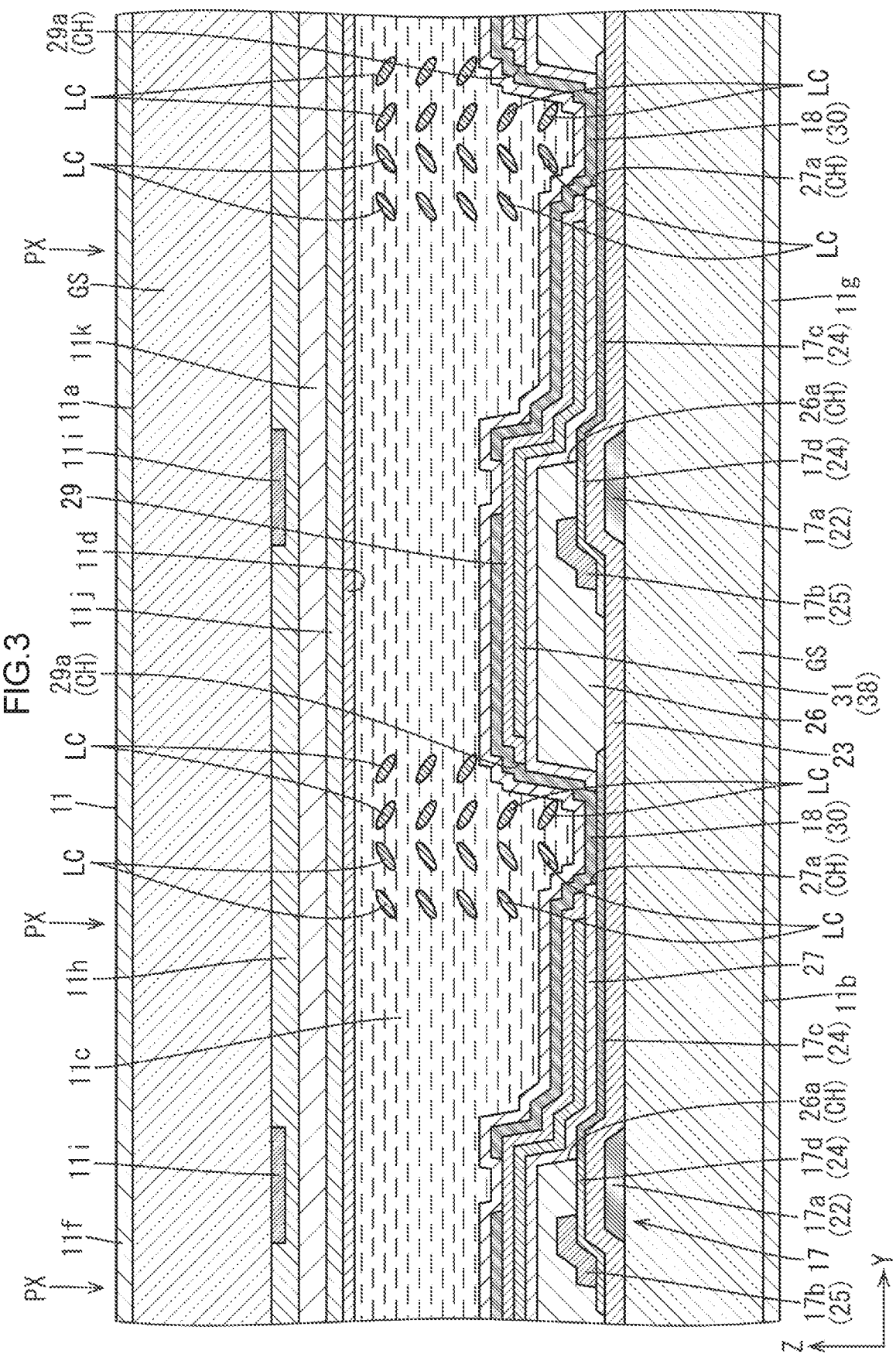
FIG. 3 is a schematic cross-sectional view illustrating a cross-sectional configuration of the liquid crystal panel in a display area.

As illustrated in FIG. 3, the liquid crystal panel 11 includes a pair of substrates 11a and 11b and a liquid crystal layer 11c between the substrates 11a and 11b. The liquid crystal layer 11c includes liquid crystal molecules having optical characteristics that vary according to application of electric field. The substrates 11a and 11b are bonded together with a sealing agent, which is not illustrated, with a gap therebetween. A size of the gap corresponds to the thickness of the liquid crystal layer 11c. One of the substrates 11a and 11b on the front is a CF board (a common substrate) 11a and one on the rear (on the back) is an array board (a thin film transistor substrate, an active matrix substrate) 11b. The CF board 11a and the array board 11b include glass substrates GS that are substantially transparent (i.e., having high light transmissivity). Various films are formed in layers on an inner surface of each glass substrate GS. Alignment films 11d and 11e are formed on inner surfaces of the substrates 11a and 11b that are opposite the liquid crystal layer 11c, respectively, for alignment of the liquid crystal material (liquid crystal molecules) included in the liquid crystal layer 11c. The liquid crystal material included in the liquid crystal layer 11c is negative nematic liquid crystal material. In an initial state (no current is supplied) where no electric field is between the substrates 11a, 11b, the liquid crystal molecules LC are aligned about vertically with respect to each alignment film 11d, 11e that is a surface of each substrate 11a, 11b. An operation mode of the liquid crystal panel 11 of this embodiment is a so-called vertical alignment (VA) mode. The liquid crystal panel 11 is a normally black type and a section of the liquid crystal layer 11c where no voltage is applied has lowest transmittance. In FIG. 3, alignment of the liquid crystal molecules LC included in the liquid crystal layer 11c is schematically illustrated. Polarizing plates 11f and 11g are attached to outer surfaces of the substrates 11a and 11b, respectively.

Figure 4:
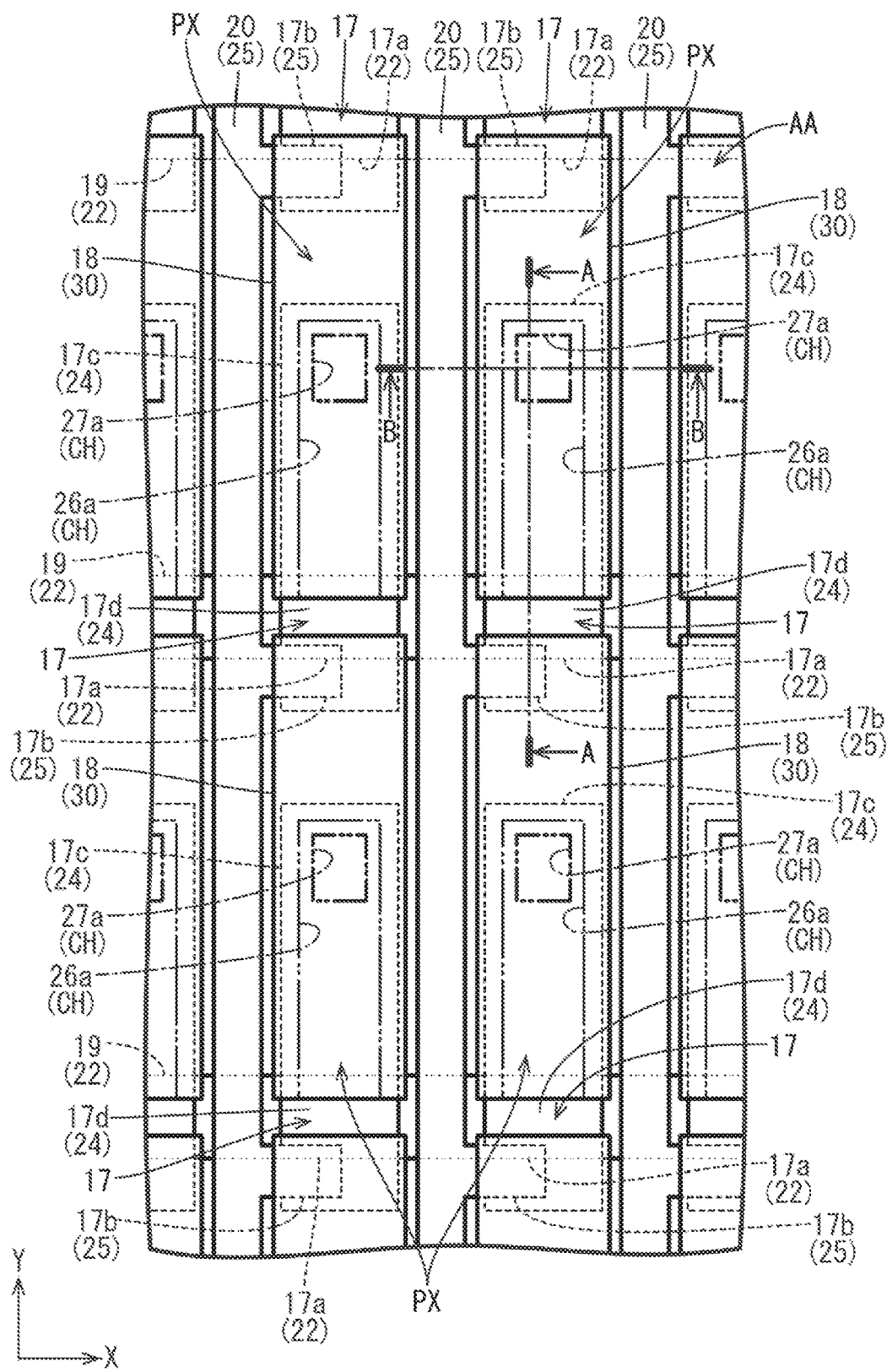
FIG. 4 is a plan view schematically illustrating a plan-view configuration of an array board of the liquid crystal panel in the display area.

Next, configurations of components in the display area AA of the array board 11b and the CF board 11a will be described in sequence. As illustrated in FIGS. 3 and 4, on the inner surface of the array board 11b, thin film transistors (TFTs) 17, which are switching components, and pixel electrodes 18 are disposed in a matrix. Furthermore, gate lines (row control lines, scanning lines) 19 and source lines (column control lines, data lines) 20 are routed in a matrix around the TFTs 17 and the pixel electrodes 18. Namely, the TFTs 17 and the pixel electrodes 18 are arranged in a matrix at respective corners defined by the gate lines 19 and the source lines 20 that are formed in a matrix. The TFTs 17 and the pixel electrodes 18 are arranged in columns and rows in a row direction (the X-axis direction) and a column direction (the Y-axis direction). The gate lines 19 extend linearly in the X-axis direction and the source lines 20 extend linearly in the Y-axis direction. The X-axis direction matches the extending direction of the gate lines 19 and the Y-axis direction matches the extending direction of the source lines 20. Specific configurations of the TFTs 17 and the pixel electrodes 18 will be described later.

Figure 5:
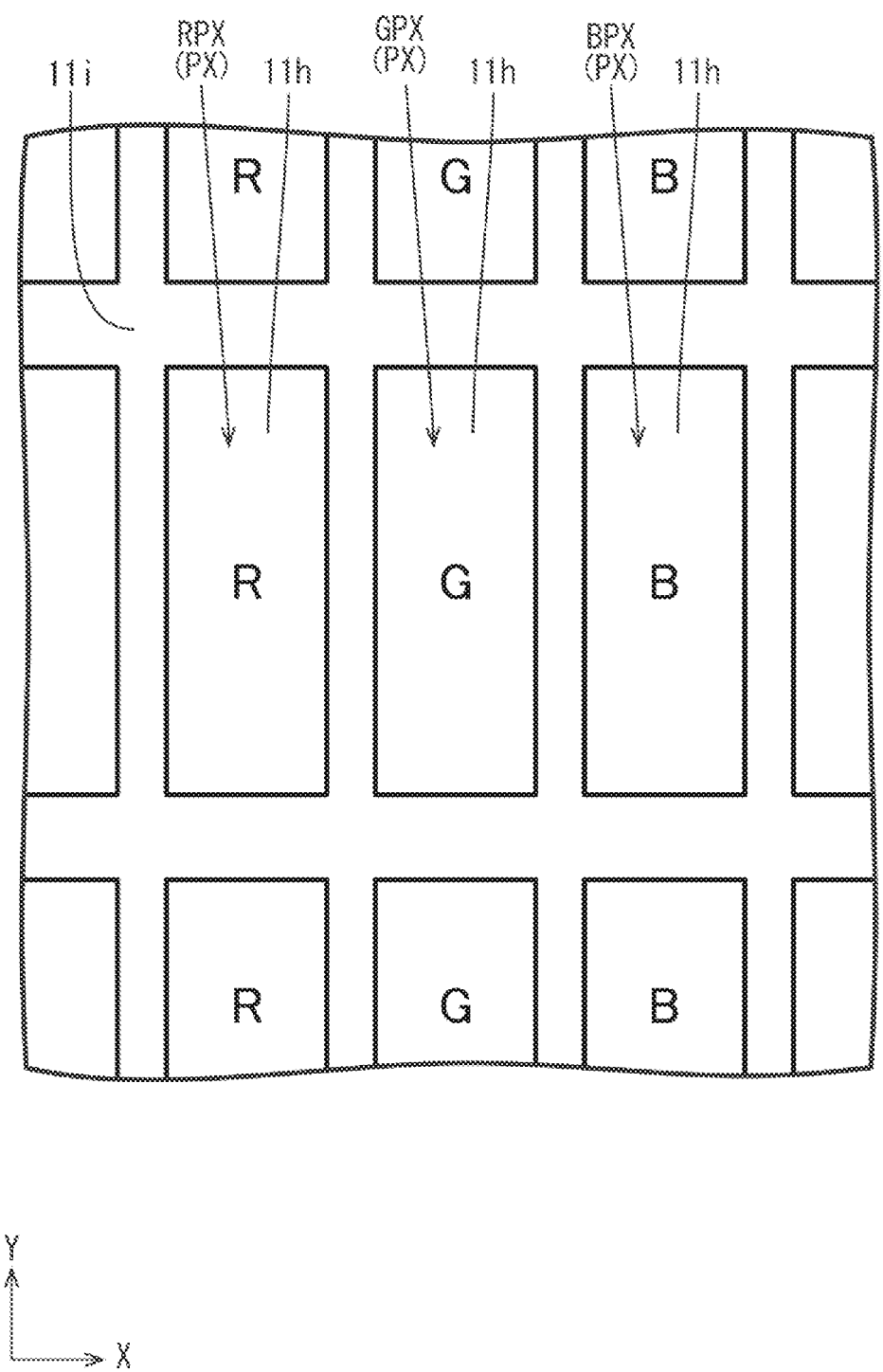
FIG. 5 is an enlarged plan view illustrating a plan-view configuration of a CF board of the liquid crystal panel in the display area.

As illustrated in FIGS. 3 and 5, the CF board 11a includes color filters 11h including red (R), green (G), and blue (B) color portions on the inner surface thereof (on the liquid crystal layer 11c side, a surface opposite the array board 11b). The color portions of the color filters 11h are arranged in a matrix in the row direction (the X-axis direction) and the column direction (the Y-axis direction) so as to overlap the respective pixel electrodes 18 on the array board 11b in a plan view. The color portions that are adjacent in the X-axis direction exhibit different colors and the color portions that are adjacent in the Y-axis direction exhibit the same color. A light blocking section (a black matrix, a light blocking section) 11i is formed in a grid and arranged between the color portions of the color filters 11h for preventing colors from mixing. The light blocking section 11*i* is arranged over the gate lines 19 and the source lines 20 in a plan view. Portions of the light blocking section 11*i* overlapping the source lines 20 in the plan view (the portions extending in the Y-axis direction) are arranged between the color portions of the color filters 11*h* exhibiting different colors and mainly exert the function of restricting color mixture. The light blocking section 11*i* is made of material having a light blocking property such as titanium (Ti), and has a film thickness of approximately 200 nm. Each of the color portions of the color filters 11*h* is thicker than the light blocking section 11*i* and is disposed to cover the light blocking section 11*i*. As illustrated in FIGS. 3 to 5, each display pixel PX of the liquid crystal panel 11, which is a display unit, includes three color portions, that is, R, G and B color portions and three pixel electrodes 18 opposite the color portions, respectively. The display pixel PX includes a red pixel RPX including the R color portion, a green pixel GPX including the G color portion, and a blue pixel BPX including the B color portion. The pixels RPX, GPX, BPX are arranged on the plate surface of the liquid crystal panel 11 in a repeated sequence along the row direction (the X-axis direction) and form groups of pixels. The groups of pixels are arranged along the column direction (the Y-axis direction).

As illustrated in FIG. 3, an overcoat film 11*k* is disposed over an inner surface of the color filters 11*h*. The overcoat film 11*k* is disposed in a solid pattern over a substantially entire area of the inner surface of the CF board 11*a* and has a film thickness same as or larger than that of the color filter 11*h*. A counter electrode 11*j* is disposed over an inner surface of the overcoat film 11*k*. The counter electrode 11*j* is disposed in a solid pattern over a substantially entire area of the inner surface of the CF board 11*a*. The counter electrode 11*j* is made of transparent electrode material such as indium tin oxide (ITO) and has a film thickness of approximately 100 nm. The counter electrode 11*j* is always maintained at a constant reference potential. If a potential is supplied to each pixel electrode 18 connected to each TFT 17 according to driving of each TFT 17, potential difference is generated between the counter electrode 11*j* and each pixel electrode 18. Alignment state of the liquid crystal molecules LC contained in the liquid crystal layer 11*c* is altered according to the potential difference generated between the counter electrode 11*j* and each pixel electrode 18. Accordingly, polarization of the transmission light is altered. Thus, the transmission light amount of the liquid crystal panel 11 is controlled for every display pixel PX independently and a predetermined color image can appear on the display panel.

Figure 6:
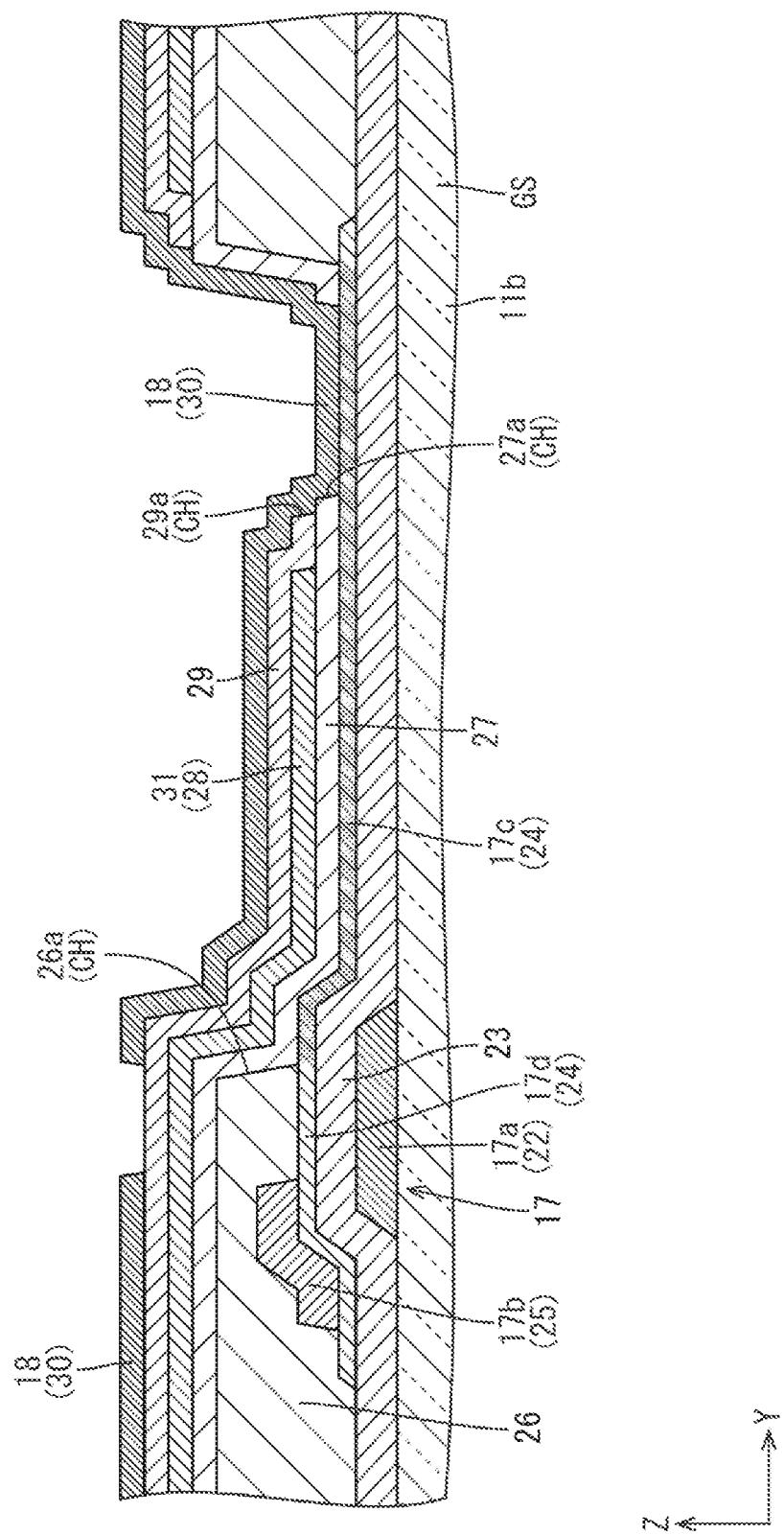
FIG. 6 is a cross-sectional view of FIG. 4 along line A-A.

The films are formed in layers on the inner surface of the array board 11*b* by a known photolithography method and the films will be described. As illustrated in FIGS. 6 and 7, on the array board 11*b*, the following films are formed in the following order from the lowest layer (the grass substrate GS): a first metal film (a gate metal film) 22, a gate insulation film 23, an oxide semiconductor film 24, a second metal film (a source metal film) 25, a first interlayer insulation film (a lower insulation film) 26, a second interlayer insulation film (an insulation film) 27, a first transparent electrode film (a lower transparent electrode film) 28, a third interlayer insulation film 29 (an upper insulation film), and a second transparent electrode film (an upper transparent electrode film) 30. The alignment film 11*e* that is disposed in an upper layer with respect to the second transparent electrode film 30 is not illustrated in FIGS. 6 and 7.

The first metal film 22 is a multilayer film including two layers of metal material such as a tungsten (W) layer and a tantalum nitride (TaN) layer. The tungsten layer preferably has a film thickness of approximately 300 nm and the tantalum nitride layer has a film thickness of approximately 30 nm. The first metal film 22 mainly forms the gate lines 19. As illustrated in FIGS. 6 and 7, the gate insulation film 23 is included in an upper layer of the first metal film 22. The gate insulation film 23 is a multilayer film including layers of synthetic resin material such as a silicon oxide ($SiO_2$) layer and a silicon nitride ($SiN_x$) layer. The silicon oxide layer preferably has a film thickness of approximately 50 nm and the silicon nitride layer has a film thickness of approximately 325 nm. The gate insulation film 23 is disposed between the first metal film 22 (such as the gate lines 19) and the second metal film 25 (such as the source lines 20), which will be described later, and the metal films are insulated from each other by the gate insulation film 23.

As illustrated in FIGS. 6 and 7, the oxide semiconductor film 24 is included in an upper layer of the gate insulation film 23 and formed from a thin film of oxide semiconductor. The oxide semiconductor film 24 preferably has a film thickness of approximately 50 nm. The oxide semiconductors included in the oxide semiconductor film 24 may be amorphous but may preferably be crystalline having crystalline qualities. The oxide semiconductors having the crystalline qualities may preferably be polycrystalline oxide semiconductors, microcrystalline oxide semiconductors, or crystalline oxide semiconductors where c-axis is oriented substantially vertical to a layer surface. The oxide semiconductor film 24 may have a multilayer structure including two or more layers. The oxide semiconductor film 24 having a multilayer structure may include an amorphous oxide semiconductor layer and crystalline oxide semiconductor layer, or may include crystalline oxide semiconductor layers having different crystal structures. The oxide semiconductor film 24 may include amorphous oxide semiconductor layers. In a two-layer structure of the oxide semiconductor film 24 including an upper layer and a lower layer, an energy gap of the oxide semiconductors included in the upper layer is preferably greater than an energy gap of the oxide semiconductors included in the lower layer. If the difference between the energy gaps of the layers is relatively small, the energy gap of the oxide semiconductors included in the lower layer may be greater than the energy gap of the oxide semiconductors included in the upper layer.

Material, structures, and film forming methods of amorphous oxide semiconductors and each of the above crystalline semiconductors and configurations of the oxide semiconductor film 24 having a multilayer structure are described in Japanese Patent Unexamined Publication Application No. 2014-007399. For reference, the entire content of JPA 2014-007399 is hereby incorporated by reference. The oxide semiconductor film 24 may include at least one of metallic elements of In, Ga, and Zn. In this embodiment, the oxide semiconductor film 24 contains In—Ga—Zn—O semiconductors containing indium (In), gallium (Ga), zinc (Zn), and oxide (O) as main components. The In—Ga—Zn—O semiconductors are ternary oxide of indium (In), gallium (Ga), and zinc (Zn), and the ratio (composition ratio) of In, Ga, and Zn is not particularly limited but may be In:Ga:Zn=2:2:1, In:Ga:Zn=1:1:1, or In:Ga:Zn=1:1:2. The oxide semiconductor film 24 is formed from an oxide semiconductor film containing In—Ga—Zn—O semiconductors. The In—Ga—Zn—O semiconductors may be amorphous or crystalline having crystalline qualities. The oxide semiconductors having the crystalline qualities may preferably be crystalline In—Ga—Zn—O semiconductors where c-axis is oriented substantially vertical to a layer surface.

A crystal structure of the crystalline In—Ga—Zn—O semiconductors is described in Japanese Patent Unexamined Publication Application No. 2014-007399, Japanese Patent Unexamined Publication Application No. 2012-134475, or Japanese Patent Unexamined Publication Application No. 2014-209727. For reference, the entire contents of JPA 2012-134475 and JPA 2014-209727 are hereby incorporated by reference. The TFTs including the In—Ga—Zn—O semiconductor layer have high electron mobility (higher than that of an a-SiTFT, for example, 20 times higher or more) and low leakage current (less than 1/100 compared to that of an a-SiTFT). The TFTs including the In—Ga—Zn—O semiconductor layer are preferably used as driving TFTs (TFTs included in the driver circuit disposed on the substrate same as the display area near the display area including the display pixels) and the TFTs (TFTs included in the pixels) 17.

The oxide semiconductor film 24 may include other oxide semiconductors instead of the In—Ga—Zn—O semiconductors. For example, the oxide semiconductor film 24 may include In—Sn—Zn—O semiconductors (such as $In_2O_3$—$SnO_2$—ZnO;InSnZnO). The In—Sn—Zn—O semiconductors are ternary oxide of indium (In), tin (Sn), and zinc (Zn). The oxide semiconductor film 24 may include In—Al—Zn—O semiconductors, In—Al—Sn—Zn—O semiconductors, Zn—O semiconductors, In—Zn—O semiconductors, Zn—Ti—O semiconductors, Cd—Ge—O semiconductors, Cd—Pb—O semiconductors, cadmium oxide (CdO), Mg—Zn—O semiconductors, In—Ga—Sn—O semiconductors, In—Ga—O semiconductors, Zr—In—Zn—O semiconductors, or Hf—In—Zn—O semiconductors.

As illustrated in FIGS. 6 and 7, the second metal film 25 is included in an upper layer of the oxide semiconductor film 24. The second metal film 25 is a multilayer film including three metal layers such as a titanium (Ti) layer, an aluminum (Al) layer, and a titanium layer. Preferably, the bottom titanium layer has a film thickness of approximately 100 nm, the aluminum layer has a film thickness of approximately 200 nm, and the upper titanium layer has a thickness of approximately 30 nm. The second metal film 25 mainly forms the source lines 20. The first interlayer insulation film 26 is at least above the second metal film 25. The first interlayer insulation film 26 is made of synthetic resin material such as silicon oxide (SiO2) and preferably has a film thickness of approximately 300 nm. The second interlayer insulation film 27 is included in an upper layer of the first interlayer insulation film 26. The second interlayer insulation film 27 is made of synthetic resin material such as silicon nitride (SiN) and preferably has a film thickness of 100 nm. Namely the second interlayer insulation film 27 preferably has a film thickness smaller than that of the first interlayer insulation film 26. In this embodiment, silicon nitride is used as the material of the second interlayer insulation film 27 and the material contains hydrogen. The first interlayer insulation film 26 and the second interlayer insulation film 27 are disposed between the first transparent electrode film 28 and each of the second metal film 25 and the oxide semiconductor film 24 and insulation is established therebetween.

As illustrated in FIGS. 6 and 7, the first transparent electrode film 28 is included in an upper layer of the second interlayer insulation film 27. The first transparent electrode film 28 is made of transparent electrode material such as indium zinc oxide (IZO) and has a film thickness of substantially 100 nm. The first transparent electrode film 28 is disposed in a solid pattern to collectively cover the display pixels PX on the array board 11b and forms an auxiliary capacitance electrode 31 that overlaps the pixel electrode 18 while having the third interlayer insulation film 29, which will be described later, therebetween. The auxiliary capacitance electrode 31 generates electrostatic capacity with the pixel electrode 18 and holds the potential charged in the pixel electrode 18 for a certain period. The auxiliary capacitance electrode 31 has holes in an island form at positions overlapping the contact holes CH of the display pixels PX. The third interlayer insulation film 29 is included in an upper layer of the first transparent electrode film 28. The third interlayer insulation film 29 is made of synthetic resin material such as silicon nitride (SiN) and preferably has a film thickness of about 100 nm. The third interlayer insulation film 29 is between the first transparent electrode film 28 and the second transparent electrode film 30 and insulation is established therebetween. The second transparent electrode film 30 is included in an upper layer of the third interlayer insulation film 29. The second transparent electrode film 30 is made of transparent electrode material such as IZO similarly to the first transparent electrode film 28 and has a film thickness of about 100 nm. The second transparent electrode film 30 mainly forms the pixel electrode 18.

A configuration of each TFT 17 will be described in detail. As illustrated in FIGS. 4 and 6, each TFT 17 includes a gate electrode 17a, a channel section 17d, a source section 17b, and a drain section 17c. The gate electrode 17a is formed from a part of the gate lines 19. The channel section 17d is formed from the oxide semiconductor film 24 and arranged so as to overlap the gate electrode 17a while having the gate insulation film 23 therebetween. The source section 17b is formed from the second metal film 25 that forms the source lines 20 and is included in an upper layer of the channel section 17d and connected to one end of the channel section 17d. The drain section 17c is formed from the oxide semiconductor film 24 that forms the channel section 17d and is connected to the other end of the channel section 17d and the pixel electrode 18. The drain section 17c is formed from a low resistance section that is a section of the oxide semiconductor film 24 where resistance is decreased. The drain section 17c functions as a conductive member having a certain resistance (for example, resistance of about 1/10000000000 to 1/100 of the resistance of the channel section 17d that is a non-lowered resistance section). In FIG. 6, the drain section 17c (the low resistance section of the oxide semiconductor film 24) is illustrated with shading. The source section 17b, the channel section 17d, and the drain section 17c included in the TFT 17 are arranged in the Y-axis direction. The channel section 17d and the drain section 17c included in the TFT 17 extend in the Y-axis direction. The arrangement direction in which the source section 17b, the channel section 17d, and the drain section 17c are arranged is parallel to the extending direction of each of the channel section 17d and the drain section 17c. According to such a configuration, the arrangement space of the TFT 17 in the X-axis direction (the extending direction of the gate lines 19) is reduced and the interval between the display pixels PX in the X-axis direction is reduced. This is preferably for achieving high precision of display.

More in detail, as illustrated in FIG. 4, the TFT 17 is disposed in a substantially middle of the display pixel PX in the X-axis direction and at a lower edge of the display pixel PX in the Y-axis direction in FIG. 4. The gate electrode 17a of the TFT 17 is formed from a portion of the gate line 19 disposed on a lower side with respect to the display pixel PX in FIG. 4 and the portion of the gate line 19 between the two source lines 20 defining the display pixel PX forms the gate electrode 17a. The gate electrode 17a does not project from or recessed from the side edges of the gate line 19 with respect to the Y-axis direction. The source section 17b is formed from a branched section that projects from the source line 20 in the X-axis direction (the extending direction of the gate line 19) and a part of the source section 17b overlaps the gate line 19 (the gate electrode 17a). More specifically, the source section 17b is offset from the gate line 19 in the Y-axis direction on an opposite side from the display pixel PX that is to be connected to. Apart of the source section 17b close to the drain section 17c overlaps the gate line 19 (the gate electrode 17a). However, most part of the source section 17b projects toward the adjacent display pixel PX that is on a lower side in the Y-axis direction in FIG. 4. Thus, most part of the source section 17b overlaps the pixel electrode 18 of the adjacent display pixel PX. In other words, most part of the pixel electrode 18 is disposed on the display pixel PX of itself. However, a part of the pixel electrode 18 overlaps the source section 17b of the TFT 17 of the adjacent display pixel PX on the upper side with respect to the Y-axis direction in FIG. 4. The pixel electrode 18 is arranged to be fit in a space having a vertically long rectangular plan view shape surrounded by the two gate lines 19 and two source lines 20 that define the area of the display pixel PX including the pixel electrode 18. The pixel electrodes 18 are arranged at intervals in the X-axis direction and the Y-axis direction in a grid and form a light transmission section (a non-light blocking section) in the liquid crystal panel 11 through which light rays transmit. The channel section 17d overlaps the gate electrode 17a and is sandwiched by the source section 17b and the drain section 17c with respect to the Y-axis direction and extends in the Y-axis direction. The channel section 17d is formed from a section of the oxide semiconductor film 24 where resistance is not decreased (the non-lowered resistance section). In the TFT 17 of this embodiment, the channel section 17d does not include an edge stop layer and a lower edge surface of the source section 17b on the channel section 17d side is contacted with an upper surface of the oxide semiconductor film 24.

As illustrated in FIGS. 4 and 6, the drain section 17c is opposite the source section 17b while having an interval of the channel section 17d, and an entire area of the drain section 17c overlaps the pixel electrode 18 that is to be connected to. The drain section 17c extends in the Y-axis direction straightly from one end continuous from the channel section 17d to another end that is to be connected to the pixel electrode 18. The channel section 17d side (source section 17b side) end portion of the drain section 17c overlaps the gate electrode 17a. The drain section 17c of the oxide semiconductor film 24 includes another end portion opposite from the channel section 17d side. As illustrated in FIG. 7, the other end portion of the drain section 17c is connected to the pixel electrode 18 formed from the second transparent electrode film 30 via the contact holes CH in the first interlayer insulation film 26, the second interlayer insulation film 27, and the third interlayer insulation film 29 that are between the drain section 17c and the pixel electrode 18. As illustrated in FIGS. 4 and 7, the contact hole CH includes a first hole (a lower hole) 26a in the first interlayer insulation film 26, a second hole (a hole) 27a in the second interlayer insulation film 27, and a third hole (an upper hole) 29a in the third interlayer insulation film 29 and the three holes are overlapped to form the contact hole CH. The first hole 26a has a vertically long rectangular plan view shape and relatively larger than the second hole 27a and the third hole 29a in the X-axis direction and the Y-axis direction. The first hole 26a has a hole width (a dimension in the X-axis direction) that is smaller than a width dimension of the pixel electrode 18, an interval between the display pixels PX, and a width dimension of the oxide semiconductor film 24. The second hole 27a has a substantially vertically long rectangular plan view shape and has a hole width smaller than the hole width of the first hole 26a (the width dimension of the pixel electrode 18, the interval between the display pixels PX, and the width dimension of the oxide semiconductor film 24). The second hole 27a has a plan view area that is smaller than that of the first hole 26a and the third hole 29a and included in the first hole 26a and the third hole 29a. Thus, the area of the second hole 27a defines the area of the contact hole CH. The third hole has a vertically long rectangular plan view shape slightly larger than that of the second hole 27a. In FIG. 4, the area of the first hole 26a is illustrated with a relatively thin dashed line and the area of the second hole 27a is illustrated with a relatively thick dashed line, and the third hole 29a is not illustrated.

As illustrated in FIG. 4, a connection section of the drain section 17c and the pixel electrode 18, that is the second hole 27a of the contact hole CH, is at a section that does not overlap the gate electrode 17a, specifically, at a substantially middle section of the display pixel PX in the X-axis direction and the Y-axis direction. In the TFT 17 having such a configuration, if a scanning signal is supplied to the gate line 19 and the gate electrode 17a that is formed from a part of the gate line 19, electrons move from the source section 17b to the drain section 17c via the channel section 17d. The drain section 17c is connected to the pixel electrode 18 via the contact hole CH formed in the first interlayer insulation film 26 and the second interlayer insulation film 27 so that the electrons moved to the drain section 17c move to the pixel electrode 18 and the pixel electrode 18 is charged. The drain section 17c of the TFT 17 is formed from the low resistance section that is a section of the oxide semiconductor film 24 having a decreased resistance. Therefore, light transmission amount in the display pixel PX is increased and the aperture ratio of the display pixel PX is increased compared to a configuration including the drain section made of conductive material having a light blocking property. Furthermore, the second interlayer insulation film 27 has the second hole 27a in a position that does not overlap the gate electrode 17a. Therefore, the plan view arrangement of the gate lines 19 and the second hole 27a has greater variation compared to a prior art configuration that the contact hole overlaps the gate electrode 17a. Specifically, the second hole 27a is at the middle of the display pixel PX while the gate line 19 overlapping the light blocking section 11i on the CF board 11a side. The gate line 19 is overlapped with the light blocking section 11i and the aperture ratio of the display pixel PX is improved and the display precision is preferably improved. Furthermore, a recess is formed on the surface of the array board 11b according to forming of the second hole 27a (the contact hole CH) and the recess is positioned at the substantially middle of the display pixel PX. Accordingly, as illustrated in FIG. 3, the liquid crystal molecules LC included in the liquid crystal layer 11c can be radially oriented in an initial state. Compared to a configuration in which another recess or projection for controlling alignment of the liquid crystal molecules is formed separately from the second hole 27a (the contact hole CH), the space for the recess or the projection is not necessary and the interval between the display pixels PX can be reduced and the display precision can be preferably increased.

Figure 8:
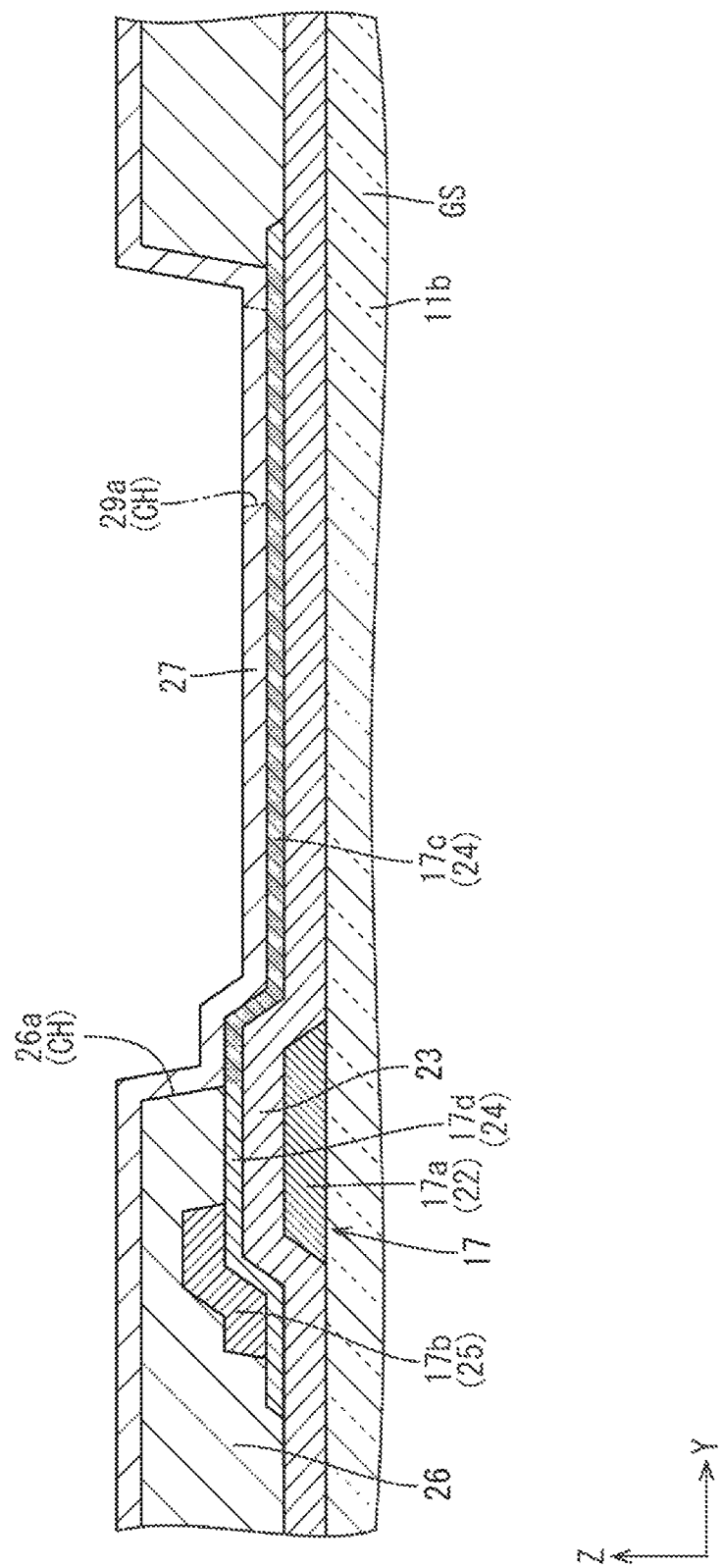
FIG. 8 is a cross-sectional view of a cross-sectional view along line A-A in FIG. 4 illustrating a process of producing an array substrate where a second interlayer insulation film is formed.

As illustrated in FIGS. 6 and 7, an entire area of the drain section 17c overlaps the first hole 26a of the first interlayer insulation film 26. In the process of producing the array board 11b, as illustrated in FIG. 8, the second interlayer insulation film 27 disposed on the first interlayer insulation film 26 is directly in contact with an exposed portion of the oxide semiconductor film 24 exposed through the first hole 26a of the first interlayer insulation film 26. The second interlayer insulation film 27 contains hydrogen in the material, as described before. Therefore, in a state in FIG. 8, hydrogen within the second interlayer insulation film 27 is dispersed into the exposed portion of the oxide semiconductor film 24 through the first hole 26a and the resistance of the exposed portion is lowered. Accordingly, the exposed portion of the oxide semiconductor film 24 forms the low resistance section that is the drain section 17c.

As described before, the array board (the thin film transistor substrate) 11b of this embodiment includes the thin film transistors (TFTs) 17, the pixel electrode 18, the display pixel PX, and the second interlayer insulation film (an insulation film) 27. Each of the TFTs 17 includes at least the gate line 19, the gate electrode 17a, the channel section 17d, the source section 17b, and the drain section 17c. The gate electrode 17a is formed from a part of the gate line 19. The channel section 17d is formed from the oxide semiconductor film 24 and disposed such that at least apart thereof overlaps the gate electrode 17a. The source section 17b is connected to one end of the channel section 17d and the drain section 17c is connected to the other end of the channel section 17d. The drain section 17c is formed from the oxide semiconductor film 24 having lower resistance than that of the channel section 17d. At least a part of the pixel electrode 18 overlaps the drain section 17c such that the pixel electrode 18 is connected to the drain section 17c. The display pixel PX includes at least the TFT 17 and the pixel electrode 18. The second interlayer insulation film 27 is between the pixel electrode 18 and the drain section 17c. The second interlayer insulation film 27 has the second hole (a hole) 27a that overlaps the pixel electrode 18 and the drain section 17c and does not overlap the gate electrode 17a.

According to such a configuration, in the TFT 17, if a scanning signal is supplied to the gate line 19 and the gate electrode 17a that is a part of the gate line 19, the electrons move from the source section 17b to the drain section 17c via the channel section 17d. The drain section 17c is connected to the pixel electrode 18 through the second hole 27a formed in the second interlayer insulation film 27. Therefore, the electrons that are moved to the drain section 17c move to the pixel electrode 18 and thus, the pixel electrode 18 is charged.

The drain section 17c of the TFT 17 is formed from the oxide semiconductor film 24 having resistance lower than that of the channel section 17d. Therefore, the light transmission amount in the display pixel PX is increased and the aperture ratio of the display pixel PX is increased compared to the configuration including the drain section 17c formed from the conductive material having a light blocking property. Furthermore, the second interlayer insulation film 27 has the second hole 27a in a position that does not overlap the gate electrode 17a. Therefore, the arrangement of the gate lines 19 and the second hole 27a has greater variation compared to a configuration that the second hole 27a overlaps the gate electrode 17a, and the aperture ratio of the display pixel PX is preferably increased.

The display pixels PX are arranged and the light blocking section 11i is disposed between the adjacent display pixels PX. The gate line 19 overlaps the light blocking section 11i.

According to such a configuration, the adjacent pixels PX are separated by the light blocking section 11i such that each of the pixels PX can perform a display operation independently. The gate line 19 at least a part of which forms the gate electrode 17a of the TFT 17 is disposed to overlap the light blocking section 11i. According to such a configuration, the aperture ratio of the display pixel PX is increased and the display precision is preferably increased compared to the configuration that the gate line does not overlap the light blocking section 11i.

The first interlayer insulation film (a lower insulation film) is further included in a lower layer of the second interlayer insulation film 27. The first interlayer insulation film 26 has the first hole (the lower hole) 26a overlapping an entire area of at least the drain section 17c. Thus, the first interlayer insulation film 26 disposed in the lower layer of the second interlayer insulation film 27 has the first hole 26a having an area overlapping an entire area of at least the drain section 17c. During manufacturing, resistance of a part of the oxide semiconductor film 24 is lowered through the first hole 26a in the first interlayer insulation film 26, and the drain section 17c is formed.

The second interlayer insulation film 27 is made of material containing hydrogen. Accordingly, hydrogen contained in the material of the second interlayer insulation film 27 is dispersed into the portion of the oxide semiconductor film 24 exposed through the first hole 26a formed in the first interlayer insulation film 26 and the resistance of the exposed portion is lowered and the low resistance section forms the drain section 17c.

The TFTs 17 are configured such that the arrangement direction of the source section 17b, the channel section 17d, and the drain section 17c is parallel to the extending direction of each of the channel section 17d and the drain section 17c. According to such a configuration, the arrangement space of the TFT 17 in the extending direction of the gate lines 19 is reduced and the interval between the display pixels PX is reduced. This is preferably for increasing display precision.

The liquid crystal panel (the display panel) 11 of this embodiment includes the above-described array board 11b, and the CF board (a counter substrate) 11a bonded to the array board 11b. According to the liquid crystal panel 11 having such a configuration, the aperture ratio of the display pixel PX of the array board 11b is increased and the display precision is preferably increased.

The liquid crystal layer 11c held between the array board 11b and the CF board 11a is further included. The liquid crystal layer 11c includes the liquid crystal molecules (the liquid crystal material) that are oriented vertically to the surfaces of the array board lib and the CF board 11a. The second hole 27a formed in the second interlayer insulation film 27 of the array board 11b does not overlap the gate electrode 17a. Therefore, with the configuration having the second hole 27a near the middle of the display pixel PX, the liquid crystal molecules LC included in the liquid crystal layer 11c can be radially oriented with using the second hole 27a. Therefore, compared to the configuration including a projection or a recess for controlling the alignment of the liquid crystal molecules LC in addition to the second hole 27a, the interval between the display pixels PX can be decreased by an unnecessary space for the projection or the recess. Display precision can be further increased.

<Second Embodiment>

A second embodiment according to the present invention will be described with reference to FIGS. 9 to 11. In the second embodiment, arrangement and a size of a first hole 126a are altered. Similar configurations, operations, and effects to the first embodiment described above will not be described.

Figure 9:
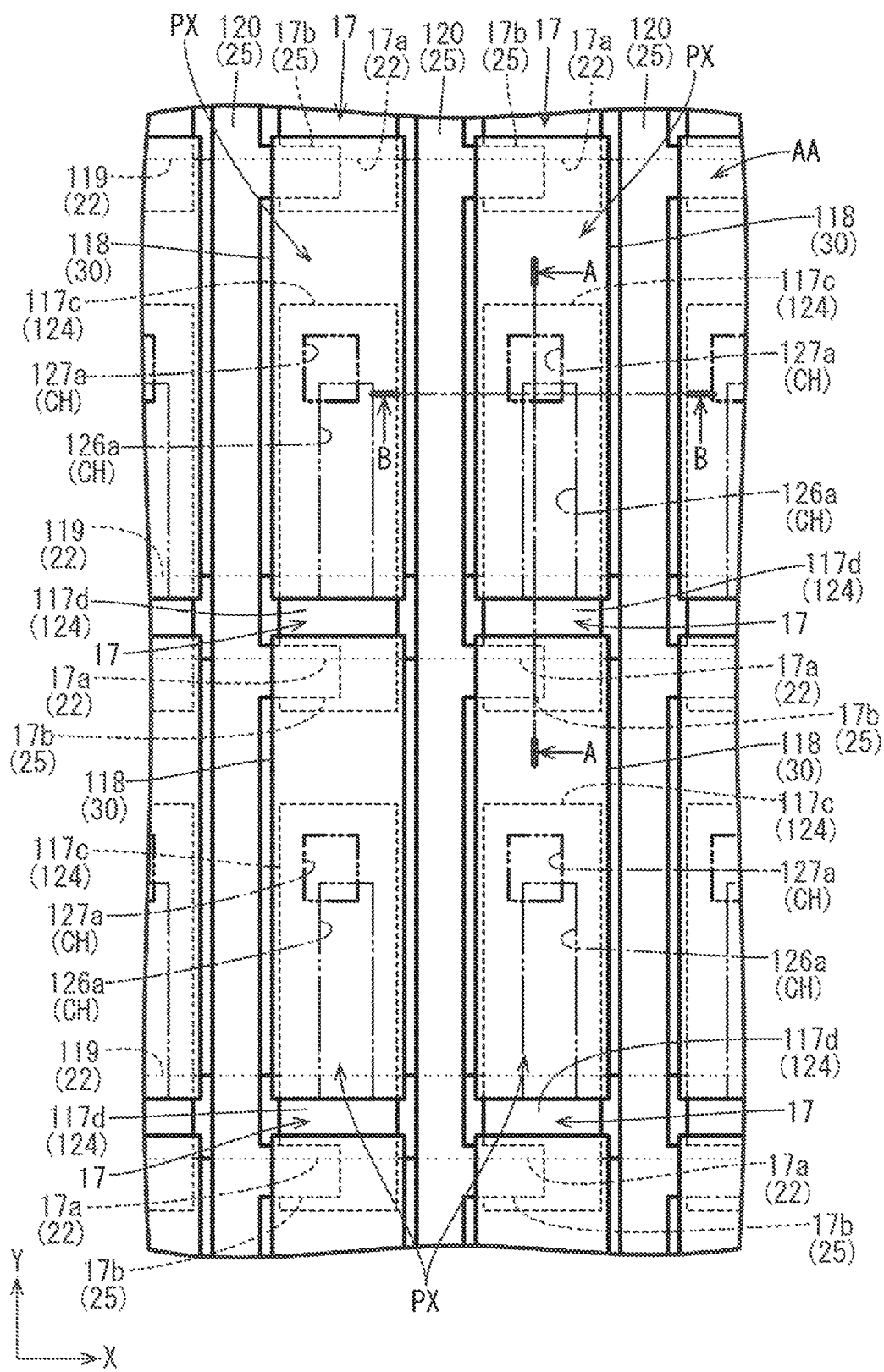
FIG. 9 is a plan view schematically illustrating a plan view configuration of an array substrate of a liquid crystal panel in a display area according to a second embodiment of the present invention.
Figure 10:
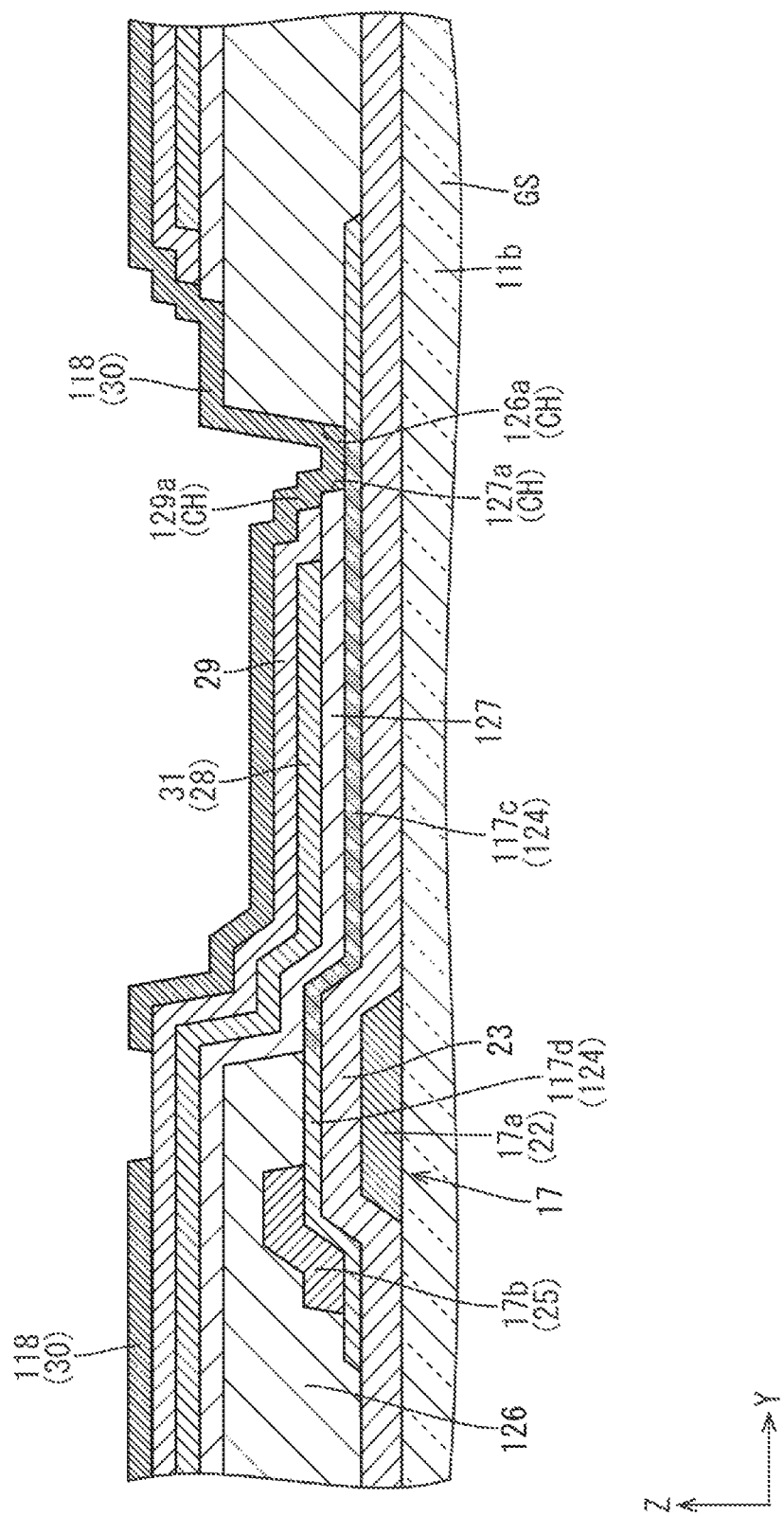
FIG. 10 is a cross-sectional view of FIG. 9 along line A-A.
Figure 11:
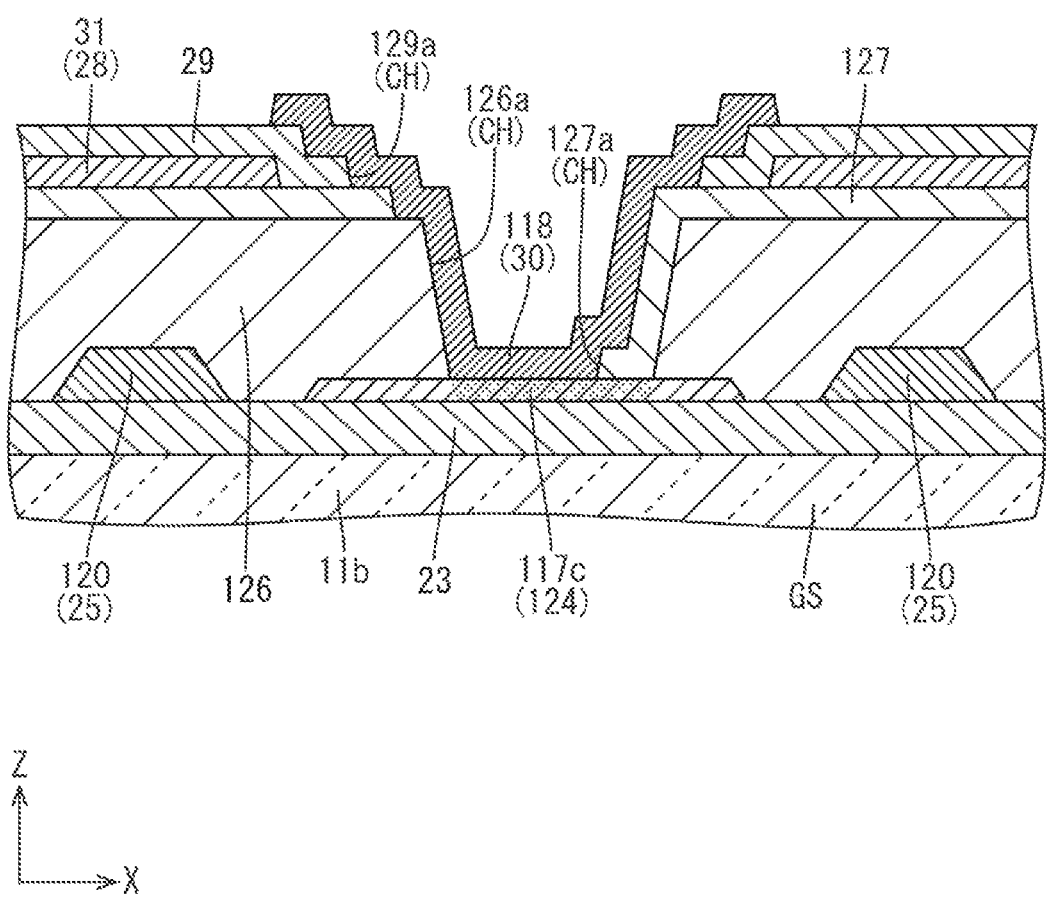
FIG. 11 is a cross-sectional view of FIG. 9 along line B-B.

As illustrated in FIGS. 9 to 11, a first interlayer insulation film 126 of this embodiment has the first hole 126a and the first hole 126a is formed with arrangement and a size so as to partially overlap a second hole 127a. In detail, as illustrated in FIGS. 9 and 11, the first hole 126a is offset from the second hole 127a with respect to the X-axis direction (the extending direction of a gate line 119). Specifically, the first hole 126a is close to the right side in FIGS. 9 and 11. The second interlayer insulation film 127 has the second hole 127b having a hole edge and a right side portion of the hole edge in FIG. 11 is contacted with an oxide semiconductor film 124 and a left side portion of the hole edge in FIG. 11 is on the first interlayer insulation film 126. Furthermore, as illustrated in FIGS. 9 and 10, the first hole 126a is formed such that a hole edge thereof on an opposite side from a channel section 117d in the Y-axis direction (an extending direction of a source line 120) overlaps only a channel section 117d side portion of the second hole 127a. Namely, the forming area of the first hole 126a and the drain section 117c (the low resistance section) with respect to the Y-axis direction is smaller than that of the first embodiment. According to such a configuration, in the second hole 127b of the second interlayer insulation film 127, a left portion of a hole edge thereof in FIG. 10 is in contact with the oxide semiconductor film 124 and a right portion thereof in FIG. 10 is on the first interlayer insulation film 126. According to this embodiment, the contact hole CH through which the pixel electrode 118 is connected to the drain section 117c is formed from an area in which the first hole 126a and the second hole 127a are overlapped and defined by the hole edge of the first hole 126a and the hole edge of the second hole 127a. A third hole 129a is slightly greater than the second hole 127a similarly to that of the first embodiment.

In the first embodiment, an entire area of the first hole 26a with respect to the X-axis direction overlaps the second hole 27a that is smaller than the arrangement interval between the display pixels PX. With such a configuration, the hole edge of the second hole 27a along the Y-axis dimension (that is perpendicular to the extending direction of the gate line 119) and the hole edge of the first hole 26a along the Y-axis dimension are designed to have a certain distance therebetween. According to such a design, the arrangement space for the display pixels PX in the X-axis direction may be increased (see FIG. 4). In this embodiment, as illustrated in FIG. 9, the second hole 127a having a size smaller than the arrangement interval between the display pixels PX with respect to the X-axis direction is partially overlapped with the first hole 126a. According to such a configuration, a certain distance is not required between the hole edge of the second hole 127a along the Y-axis dimension and the hole edge of the first hole 126a along the Y-axis dimension. Namely, the position relation of the hole edges of the first hole 126a and the second hole 127a along the Y-axis dimension is not necessary to be designed precisely. Therefore, the arrangement interval between the display pixels PX in the X-axis direction can be small and the display precision can be preferably increased.

As described before, according to this embodiment, the display pixels PX are arranged at least in the extending direction of the gate line 119, and the second interlayer insulation film 127 and the first interlayer insulation film 126 are formed such that the second hole 127a and the first hole 126a are smaller than the arrangement interval of the display pixels PX and partially overlapped with each other. If the second interlayer insulation film and the first interlayer insulation film are provided such that an entire area of the first hole is overlapped with the second hole 127a smaller than the arrangement interval of the display pixels PX with respect to the extending direction of the gate lines 119, the arrangement space for the display pixels PX may be increased to keep a distance between the hole edge of the second hole 127a and the hole edge of the first hole. According to the above-described configuration in that the second hole 127a and the first hole 126a that are smaller than the arrangement interval of the display pixels PX with respect to the extending direction of the gate lines 119 are partially overlapped, it is not necessary to design precisely the position relation of the hole edge of the second hole 127a and the hole edge of the first hole 126a. Therefore, the arrangement interval between the display pixels PX can be decreased and high display precision can be preferably achieved.

<Third Embodiment>

A third embodiment according to the present invention will be described with reference to FIGS. 12 to 14. In the third embodiment, an area of a first hole 226a formed in a first interlayer insulation film 226 is altered from that of the first embodiment. Similar configurations, operations, and effects to the first embodiment will not be described.

Figure 12:
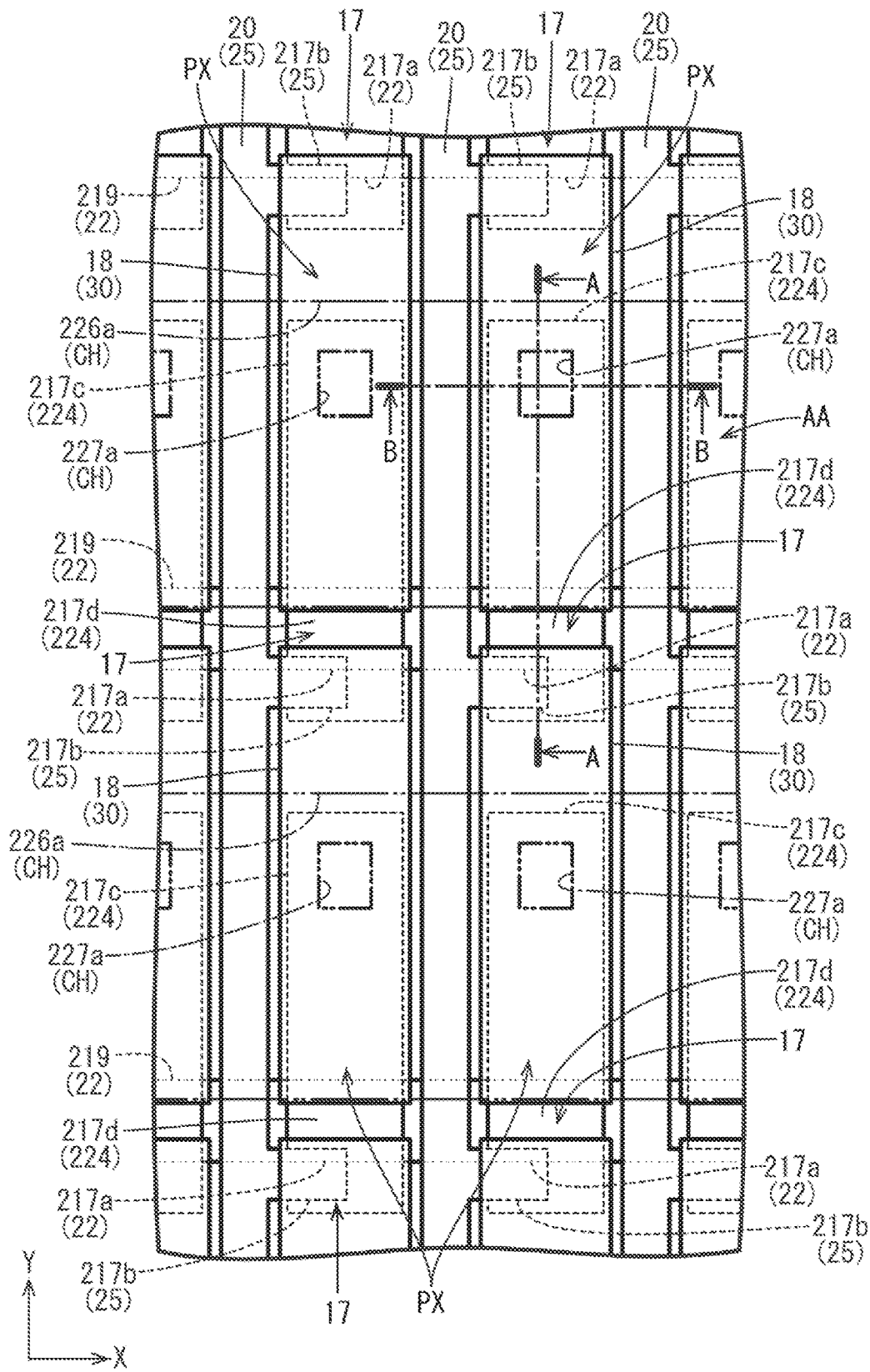
FIG. 12 is a plan view schematically illustrating a plan view configuration of an array substrate of a liquid crystal panel in a display area according to a third embodiment of the present invention.
Figure 13:
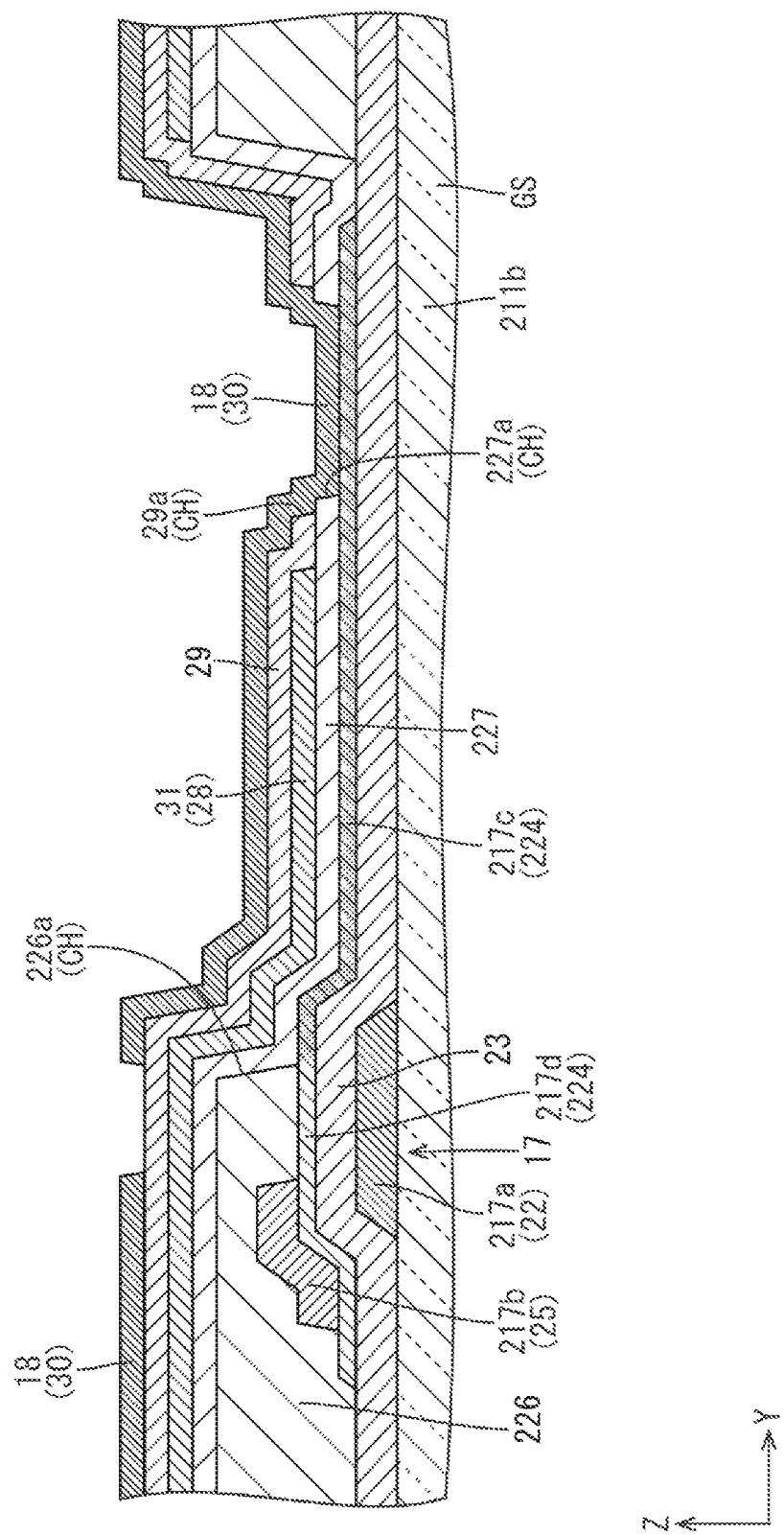
FIG. 13 is a cross-sectional view of FIG. 12 along line A-A.

As illustrated in FIG. 12, the first interlayer insulation film 226 of this embodiment has the first hole 226a that extends over the adjacent display pixels PX arranged in the X-axis direction. Specifically, the first hole 226a extends over substantially entire dimension of the display area AA in the X-axis direction and has a belt-like shape crossing all of the display pixels PX arranged in the X-axis direction. The belt-like first holes 226a are arranged at a certain interval in the Y-axis direction and arranged in horizontal stripes as a whole. The certain interval is substantially equal to the arrangement interval of the display pixels PX in the Y-axis direction and the number of the first holes 226a is same as that of the display pixels PX arranged in the Y-axis direction. The first hole 226a has a Y-axis dimension that overlaps an entire area of an upper portion (on an opposite side from the source section 217b side) of the oxide semiconductor film 224 extending in the Y-axis direction. The upper portion of the oxide semiconductor film 224 is on an upper side than the channel section 217d in FIG. 12. Entire areas (a whole width and a whole length) of the portions of the oxide semiconductor film 224 overlapping the first holes 226a are drain sections 217c having decreased resistance.

Figure 14:
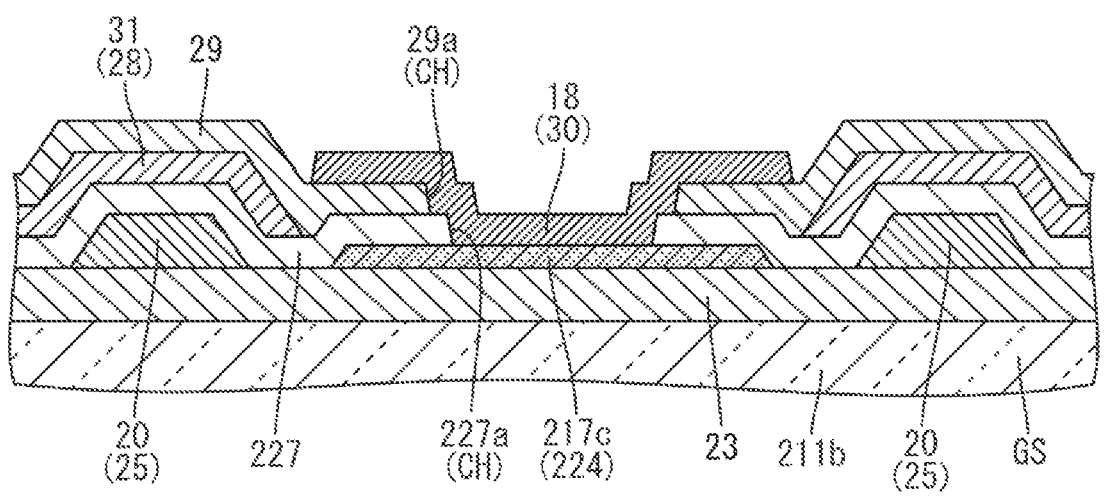
FIG. 14 is a cross-sectional view of FIG. 12 along line B-B.

According to such a configuration, as illustrated in FIGS. 12 and 14, the second hole 227a in the second interlayer insulation film 227 overlaps the first hole 226a regardless of the position of the first hole 226a in the first interlayer insulation film 226 in the X-axis direction (the extending direction of gate lines 219). Namely, the hole edge of the first hole 226a in the first interlayer insulation film 226 along the Y-axis dimension is not present within each display pixel PX. Therefore, it is not necessary to design precisely the X-axis direction position relation of the hole edge of the second hole 227a formed in the second interlayer insulation film 227 along the Y-axis dimension and the hole edge of the first hole 226a along the Y-axis dimension. Therefore, the arrangement interval of the display pixels PX in the X-axis dimension can be decreased and the high display precision can be preferably achieved. In manufacturing an array board 211b, as illustrated in FIG. 13, resistance is decreased in a larger area of the oxide semiconductor film 224 through the first hole 226a of the first interlayer insulation film 226 and the low resistance section and the drain section 217c are formed. Therefore, the resistance value of the drain section 217c is decreased.

According to this embodiment described before, the display pixels PX are arranged at least in the extending direction of the gate lines 219 and the first interlayer insulation film 226 is provided such that the first hole 226a extends over the adjacent display pixels PX that are adjacent in the extending direction. According to such a configuration, the first hole 226a overlaps the second hole 227a regardless of the position of second hole 227a with respect to the extending direction of the gate lines 219. Namely, it is not necessary to design precisely the position relation of the first hole 226a and the second hole 227a with respect to the extending direction of the gate lines 219. Therefore, the arrangement interval of the display pixels PX can be decreased and the high display precision can be preferably achieved. In manufacturing, resistance is decreased in a larger area of the oxide semiconductor film 224 through the first hole 226a of the first interlayer insulation film 226, and the drain section 217c is formed. Therefore, the resistance value of the drain section 217c is decreased.

<Fourth Embodiment>

A fourth embodiment according to the present invention will be described with reference to FIGS. 15 to 17. In the fourth embodiment, an area of a second hole 327a formed in a second interlayer insulation film 327 is altered from that of the first embodiment. Similar configurations, operations, and effects to the first embodiment will not be described.

Figure 15:
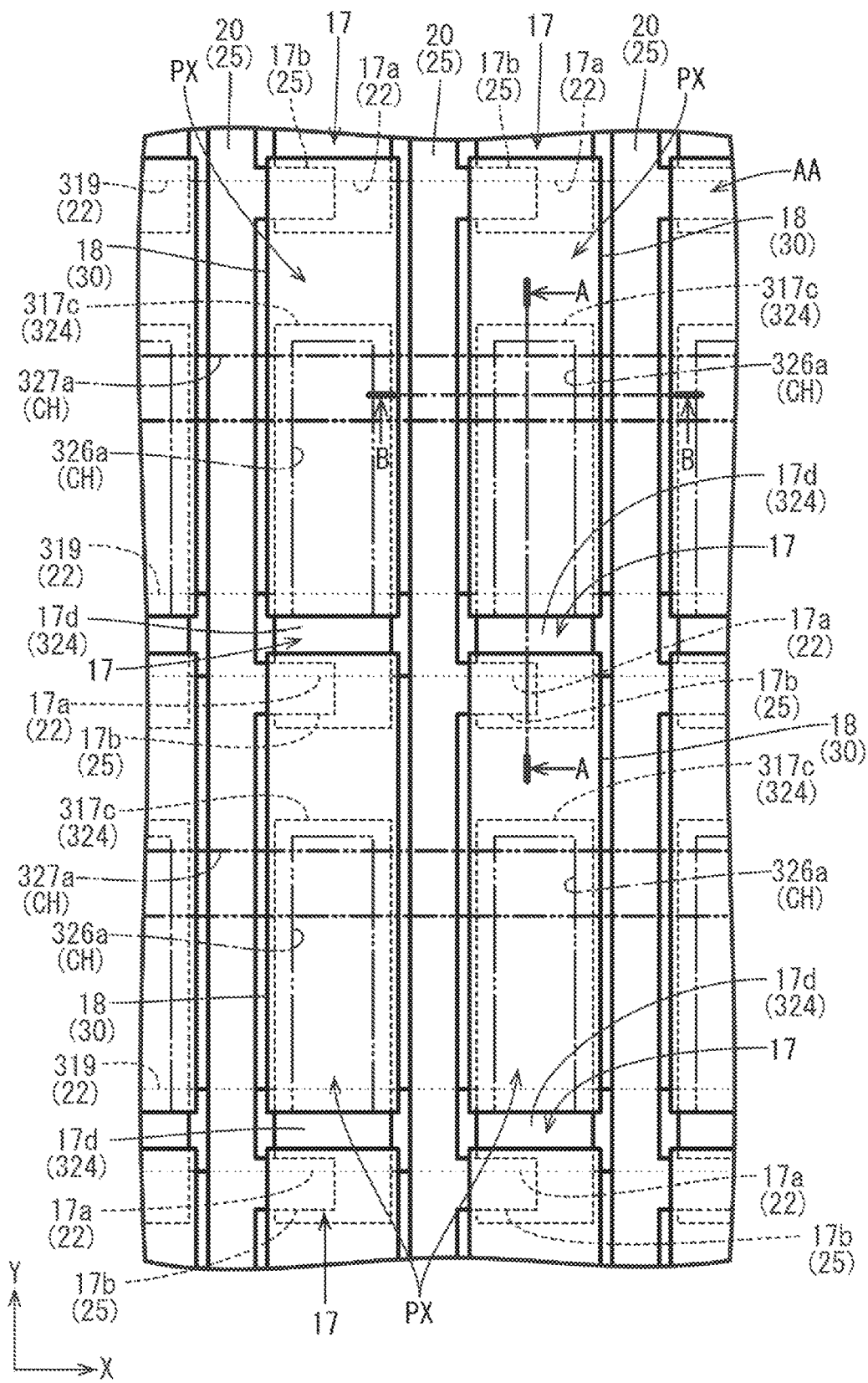
FIG. 15 is a plan view schematically illustrating a plan view configuration of an array substrate of a liquid crystal panel in a display area according to a fourth embodiment of the present invention.
Figure 16:
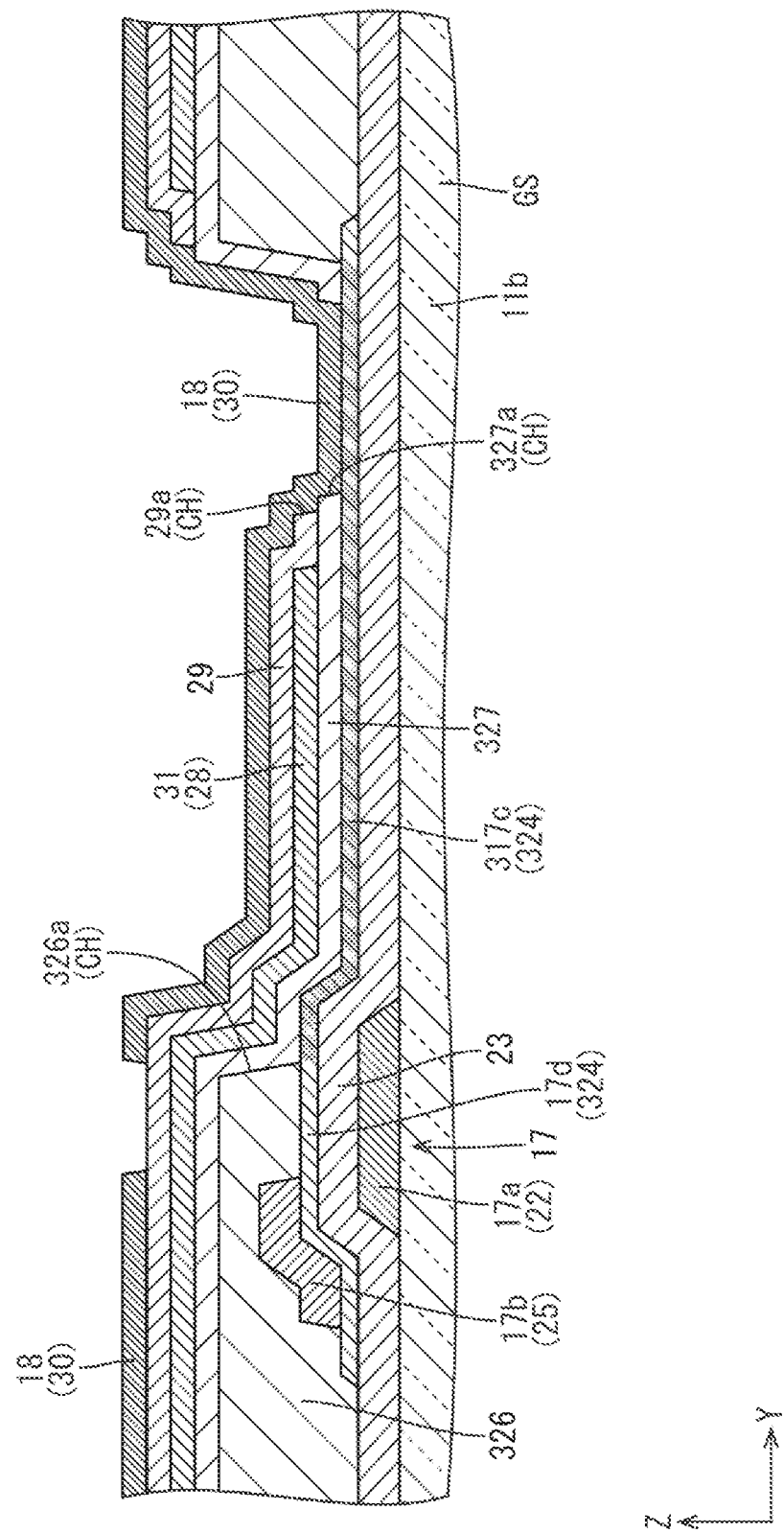
FIG. 16 is a cross-sectional view of FIG. 15 along line A-A.

As illustrated in FIG. 15, the second interlayer insulation film 327 of this embodiment has the second hole 327a that extends over the adjacent display pixels PX arranged in the X-axis direction. Specifically, the second hole 327a extends over substantially entire dimension of the display area AA in the X-axis direction and has a belt-like shape crossing all of the display pixels PX arranged in the X-axis direction. The belt-like second holes 327a are arranged at a certain interval in the Y-axis direction and arranged in horizontal stripes as a whole. The certain interval is substantially equal to the arrangement interval of the display pixels PX in the Y-axis direction and the number of the second holes 327a is same as that of the display pixels PX arranged in the Y-axis direction. The second hole 327a extends in a direction perpendicular to an extending direction of a drain section 317c (an oxide semiconductor film 324).

Figure 17:
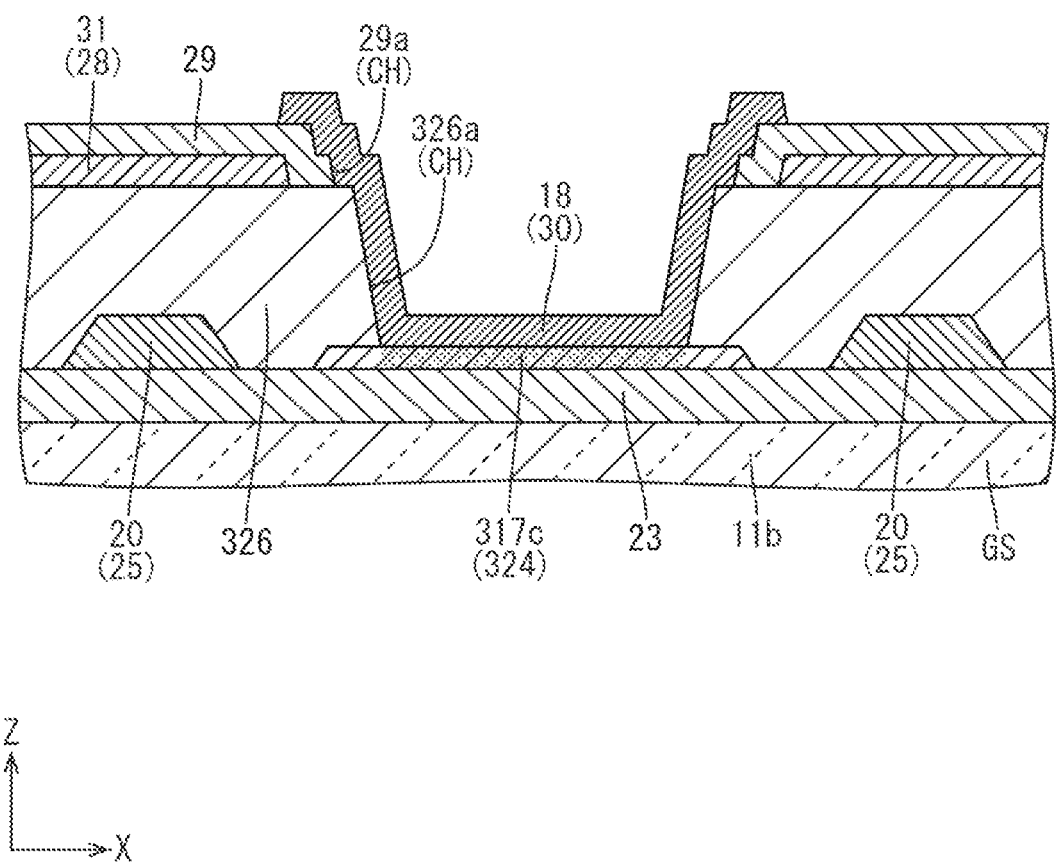
FIG. 17 is a cross-sectional view of FIG. 15 along line B-B.

According to such a configuration, as illustrated in FIGS. 15 and 17, the first hole 326a in the first interlayer insulation film 326 overlaps the second hole 327a regardless of the position of the second hole 327a in the second interlayer insulation film 327 in the X-axis direction (the extending direction of gate lines 319). Namely, the hole edge of the second hole 327a in the second interlayer insulation film 327 along the Y-axis dimension is not present within each display pixel PX. Therefore, it is not necessary to design precisely the X-axis direction position relation of the hole edge of the first hole 326a in the first interlayer insulation film 326 along the Y-axis dimension and the hole edge of the second hole 327a along the Y-axis dimension. Therefore, the arrangement interval of the display pixels PX in the X-axis dimension can be decreased and the high display precision can be preferably achieved. Furthermore, compared to the configuration of the third embodiment that the first hole 226a extends over the adjacent display pixels PX in the X-axis direction (see FIG. 12), as illustrated in FIGS. 15 and 16, the area in which the second hole 327a is formed is reduced in the Y-axis direction (the direction perpendicular to the extending direction of the gate lines 319). Therefore, it is easy to control film remaining of the second interlayer insulation film 327 in the area where the second hole 327a is formed and it is advantageous in manufacturing.

According to this embodiment, as described before, the display pixels PX are arranged at least in the extending direction of the gate lines 319 and the second interlayer insulation film 327 is formed such that the second hole 327a extends over the adjacent display pixels PX that are adjacent in the extending direction. According to such a configuration, the second hole 327a overlaps the first hole 326a regardless of the position of a first hole 326a with respect to the extending direction of the gate lines 319. Namely, it is not necessary to design precisely the position relation of the first hole 326a and the second hole 327a with respect to the extending direction of the gate lines 319. Therefore, the arrangement interval of the display pixels PX can be decreased and the high display precision can be preferably achieved. Furthermore, compared to the configuration that the first hole extends over the adjacent display pixels PX in the extending direction of the gate lines 319, the area in which the second hole 327a is formed is reduced in the direction perpendicular to the extending direction of the gate lines 319. Therefore, it is easy to control film remaining in the area where the second hole 327a is formed and it is advantageous in manufacturing.

<Fifth Embodiment>

A fifth embodiment according to the present invention will be described with reference to FIGS. 18 and 19. In the fifth embodiment, a configuration of a light blocking section 411i is altered from that of the first embodiment. Similar configurations, operations, and effects to the first embodiment will not be described.

Figure 18:
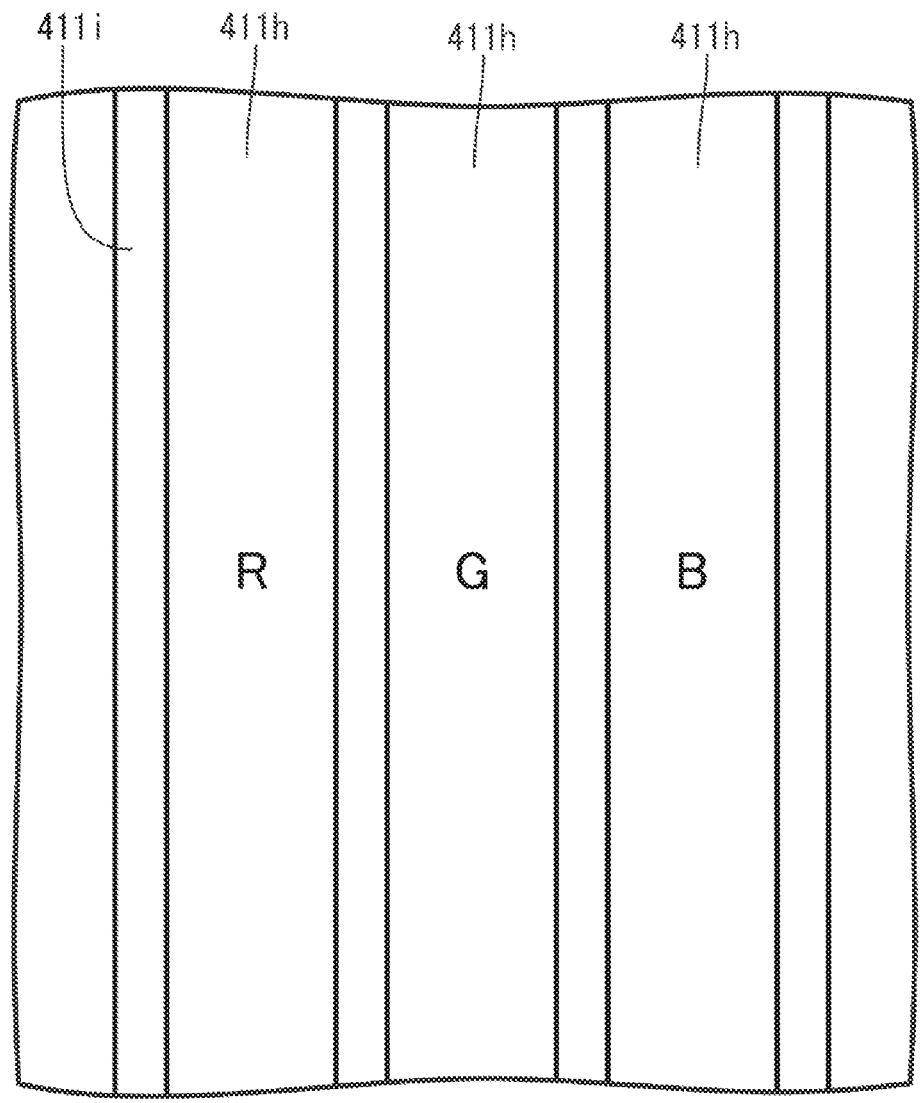
FIG. 18 is a plan view schematically illustrating a plan view configuration of a CF substrate of a liquid crystal panel in a display area according to a fifth embodiment of the present invention.

As illustrated in FIG. 18, the light blocking section 411i of this embodiment has a belt-like shape extending in the Y-axis direction (an extending direction of source lines, which are not illustrated) and is arranged between the color portions of color filters 411h arranged in the X-axis direction. The light blocking sections 411i are arranged in the X-axis direction at an interval of the color portion of the color filter 411h and in stripes as a whole. Each of the color portions of the color filters 411h has a belt-like shape extending parallel to the extending direction of the light blocking sections 411i. Namely, on a CF board 411a, the light blocking sections 411i and the color portions of the color filters 411h are arranged alternately in the X-axis direction. The light blocking sections 411i are arranged between the color portions of different colors in the color filters 411h so as to effectively prevent colors from mixing. As illustrated in FIG. 19, the light blocking section 411i is not present between the adjacent display pixels PX in the Y-axis direction, however, a non-arrangement area having no pixel electrode 418 is present therebetween. Similarly to the first embodiment, the pixel electrode 418 forms a light transmission section in a liquid crystal panel 411 and is formed in a grid in the plan view. In the non-arrangement area having no pixel electrode 418 is a light blocking area LSA through which light is less likely to transmit regardless of existence of the light blocking section 411i. According to such a configuration, the light rays of the same color in the adjacent display pixels PX in the Y-axis direction is less likely to be mixed by the light blocking area LSA (the pixel electrode 418 non-arrangement area), and the light transmission amount through each of the adjacent display pixels in the Y-axis direction can be controlled independently. The light blocking area LSA (the pixel electrode 418 non-arrangement area) has a grid shape in the plan view similarly to the light blocking section 11i of the first embodiment (see FIG. 5).

<Other Embodiments>

The present invention is not limited to the embodiments described above and illustrated by the drawings. For examples, the following embodiments will be included in the technical scope of the present invention.

(1) In each of the above embodiments, the contact hole (an overlap area of the first hole, the second hole, and the third hole) is in a middle of the pixel with respect to the X-axis direction and the Y-axis direction. However, the contact hole may be offset in the pixel with respect to one of or both of the X-axis direction and the Y-axis direction.

(2) Other than each of the above embodiments, specific forming area of each of the first hole, the second hole, and the third hole of the contact hole may be altered appropriately. For example, each of the holes or all of the holes may have a plan view shape of a horizontally long rectangle, a square, a circle, an ellipse, or an oval.

(3) In each of the above embodiments, silicon nitride is used as material of the second interlayer insulation film. However, material other than silicon nitride can be used and material containing hydrogen is preferably used. Specific material of the first interlayer insulation film and the third interlayer insulation film may be altered appropriately.

(4) In each of the above embodiments, hydrogen contained in the material of the second interlayer insulation film is dispersed into the oxide semiconductor film through the first hole of the first interlayer insulation film and lowering of the resistance of the oxide semiconductor film is accelerated. However, the lowering of the resistance of the oxide semiconductor film may be accelerated by performing a resistance lowering process such as plasma treatment or vacuum anneal treatment after forming the first holes in the first interlayer insulation film with patterning during a process of producing an array board. With such a method, material that does not contain hydrogen can be used for the second interlayer insulation film.

(5) Other than each of the above embodiments, metal material used for the first metal film and the second metal film may be altered as appropriate. A stacking structure of the first metal film and the second metal film may be altered as appropriate. For example, the number of layers may be altered, or the first metal film and the second metal film may have a single layer structure or may have an alloy structure.

(6) Other than each of the above embodiments, the transparent electrode material used for the first transparent electrode film and the second transparent electrode film may be altered as appropriate. For example, transparent electrode material such as indium tin oxide (ITO) or zinc oxide (ZnO) may be used.

(7) In each of the above embodiments, a part of the pixel electrode overlaps the source section. However, the pixel electrode may not be overlapped with the source section. In such a configuration, the pixel electrode may have a recessed section that follows a plan view shape of the source section.

(8) In each of the above embodiments, the gate lines extend linearly in the X-axis direction and the side edges thereof have no recess or projection. However, the side edges of the gate lines may have a small recess or projection. In such a configuration of the gate line including a side edge having a projection, the projection may configure a part or a whole of the gate electrode.

(9) In each of the above embodiments, substantially a whole gate line overlaps the light blocking section of the CF board. However, a part of the gate line may overlap the light blocking section or the gate line may not overlap the light blocking section.

(10) In each of the above embodiments, the auxiliary capacitance electrode (the first transparent electrode film) is included in a lower layer of the pixel electrode (the second transparent electrode film) via the third interlayer insulation film. However, the auxiliary capacitance electrode (the first transparent electrode film) and the third interlayer insulation film may not be included. In such a configuration, the auxiliary capacitance line may be formed from the first metal film and disposed parallel to the gate line such that the electrostatic capacitance may be formed between the auxiliary capacitance line and the pixel electrode to hold a potential charged in the pixel electrode for a certain period.

(11) In each of the above embodiments, the channel section does not include an edge stop layer and a lower edge surface of the source section on the channel section side is contacted with an upper surface of the oxide semiconductor film. However, TFTs of an edge stop type including an edge stop layer in an upper layer of the channel section may be used.

(12) Each of the above embodiments includes the liquid crystal panel that includes a vertical alignment (VA) mode as an operation mode. However, other liquid crystal panels are also included in the scope of the present invention, for example, a liquid crystal panel that includes an in-plane switching (IPS) mode or a fringe field switching (FFS) mode as an operation mode is also included in the scope of the present invention.

(13) Each of the above embodiments includes liquid crystal panel including the driver that is directly mounted on the array board through the COG method. However, the present invention may be applied to a liquid crystal panel of a chip on film (COF) mounting type. In such a liquid crystal panel, a flexible printed circuit board having a driver thereon is mounted on the array board.

(14) In each of the above embodiments, the liquid crystal panel includes display pixels of three colors including red, green, and blue. In addition to the red, green and blue display pixels, yellow display pixel may be included and the liquid crystal panel including display pixels of four colors is also included in the scope of the present invention.

(15) Each of the above embodiments includes the liquid crystal panel having a vertically-long rectangular shape. However, liquid crystal panels having a horizontally-long rectangular shape or a square shape are also included in the scope of the present invention. Furthermore, liquid crystal panels having a circular shape or an elliptical shape are also included in the scope of the present invention.

(16) Each of the above embodiments may further include a functional panel, such as a touch panel and a parallax barrier panel (a switching liquid crystal panel), layered and attached to the liquid crystal panel.

(17) Each of the above embodiments includes the transmission type liquid crystal display devices each including the backlight unit, which is an external light source. However, reflection type liquid crystal display devices that use outside light to display images are also included in the scope of the present invention. The reflection type liquid crystal display devices do not require backlight units. Furthermore, semi-transmission type liquid crystal display devices are included in the scope of the present invention.

(18) Each of the above embodiments includes the TFTs as switching components of the liquid crystal display device. However, liquid crystal display devices that include switching components other than TFTs (e.g., thin film diodes (TFDs)) may be included in the scope of the present invention. Furthermore, black-and-white liquid crystal display devices, other than color liquid crystal display device, are also included in the scope of the present invention.

(19) The liquid crystal display devices including the liquid crystal panels as the display panels are described as the embodiments. However, display devices that include other types of display panels (e.g., plasma display panels (PDPs), organic EL panels, electrophoretic display (EPD) panels, micro electro mechanical systems (MEMS) display panels) are also included in the scope of the present invention.

EXPLANATION OF SYMBOLS 11, 411: liquid crystal panel (display panel), 11a, 411a: CF board (counter substrate), 11b, 211b: array board (thin film transistor substrate), 11c: liquid crystal layer, 11i: light blocking section (light blocking area), 17: TFT (thin film transistor), 17a, 217a: gage electrode, 17b, 217b: source section, 17c, 117c, 217c, 317c: drain section, 17d, 117d, 217d: channel section, 18, 118, 418: pixel electrode, 19, 119, 219, 319: gate line, 24, 124, 224, 324: oxide semiconductor film, 26, 126, 226, 326: first interlayer insulation film (lower insulation film), 26a, 126a, 226a, 326a: first hole (lower hole), 27, 127, 227, 327: second interlayer insulation film (insulation film), 27a, 127a, 227a, 327a: second hole (hole), LC: liquid crystal molecules (liquid crystal material), LSA: light blocking area, PX: display pixel

The invention claimed is:

1. A thin film transistor substrate comprising:
    a gate line;
    a thin film transistor at least including
        a gate electrode formed from a part of the gate line,
        a channel section formed from an oxide semiconductor film and disposed such that a part of the channel section overlaps the gate electrode,
        a source section connected to one end of the channel section, and
        a drain section connected to another end of the channel section and formed from the oxide semiconductor film having resistance lower than that of the channel section,
    a pixel electrode a part of which overlaps the drain section and connected to the drain section;
    a pixel at least including the thin film transistor and the pixel electrode;
    an insulation film disposed between the pixel electrode and the drain section and having a hole in a position overlapping the pixel electrode and the drain section and not overlapping the gate electrode; and
    a lower insulation film included in a lower layer of the insulation film and having a lower hole overlapping a whole area of the drain section.

2. The thin film transistor substrate according to claim 1, wherein
    the pixel includes multiple pixels that are arranged while having a light blocking area between adjacent pixels, and
    the gate line is arranged to overlap the light blocking area.

3. The thin film transistor substrate according to claim 1, wherein the insulation film is made of material containing hydrogen.

4. The thin film transistor substrate according to claim 1, wherein
    the pixel includes multiple pixels that are arranged at least in an extending direction in which the gate line extends, and
    the insulation film and the lower insulation film are formed such that the hole and the lower hole are smaller in the extending direction than an arrangement interval of the pixels and the hole and the lower hole partially overlap each other.

5. The thin film transistor substrate according to claim 1, wherein
    the pixel includes multiple pixels that are arranged at least in an extending direction in which the gate line extends, and
    the lower insulation film is formed such that the lower hole extends over the pixels that are adjacent to each other in the extending direction.

6. The thin film transistor substrate according to claim 1, wherein
    the pixel includes multiple pixels that are arranged at least in an extending direction in which the gate line extends, and
    the insulation film is formed such that the hole extends over the pixels that are adjacent to each other in the extending direction.

7. The thin film transistor substrate according to claim 1, wherein
    the thin film transistor includes the source section, the channel section, and the drain section that are arranged in an arrangement direction, and the channel section and the drain section extend in an extending direction, and
    the arrangement direction is parallel to the extending direction.

8. A display panel comprising:
    the thin film transistor substrate according to claim 1; and
    a counter substrate bonded to the thin film transistor substrate.

9. The display panel according to claim 8, further comprising:
    a liquid crystal layer arranged between the thin film transistor substrate and the counter substrate and formed from liquid crystal material that is aligned vertical to surfaces of the thin film transistor substrate and the counter substrate.

* * * * *